(12) United States Patent
Negi et al.

(10) Patent No.: US 8,940,470 B2
(45) Date of Patent: Jan. 27, 2015

(54) PHOTOSENSITIVE RESIN AND PROCESS FOR PRODUCING MICROLENS

(75) Inventors: Takayuki Negi, Funabashi (JP);
Takahiro Sakaguchi, Funabashi (JP);
Takahiro Kishioka, Funabashi (JP)

(73) Assignee: Nissan Chemical Industries, Inc., Tokyo (JP)

( * ) Notice: Subject to any disclaimer, the term of this patent is extended or adjusted under 35 U.S.C. 154(b) by 419 days.

(21) Appl. No.: 12/451,474

(22) PCT Filed: May 14, 2008

(86) PCT No.: PCT/JP2008/058860
§ 371 (c)(1),
(2), (4) Date: Nov. 13, 2009

(87) PCT Pub. No.: WO2008/143095
PCT Pub. Date: Nov. 27, 2008

(65) Prior Publication Data
US 2010/0096663 A1 Apr. 22, 2010

(30) Foreign Application Priority Data
May 17, 2007 (JP) ................................ 2007-131444

(51) Int. Cl.
*G03F 7/023* (2006.01)
*G03F 7/38* (2006.01)
*G03F 7/00* (2006.01)
*G02B 3/00* (2006.01)

(52) U.S. Cl.
CPC ............... *G03F 7/0233* (2013.01); *G03F 7/38* (2013.01); *G03F 7/0005* (2013.01); *G02B 3/00* (2013.01)
USPC ............. 430/191; 430/18; 430/192; 430/193; 430/321; 430/326

(58) Field of Classification Search
CPC ........ G03F 7/0233; G03F 7/0005; G03F 7/38
USPC ............. 430/165, 192, 193, 270.1, 325, 326, 430/330, 512, 18, 280.1, 321
See application file for complete search history.

(56) References Cited

U.S. PATENT DOCUMENTS

| | | | |
|---|---|---|---|
| 5,153,096 A * | 10/1992 | Uenishi et al. | 430/192 |
| 5,362,597 A | 11/1994 | Sano et al. | |
| 6,228,552 B1 * | 5/2001 | Okino et al. | 430/176 |
| 6,280,897 B1 | 8/2001 | Asakawa et al. | |
| 7,439,302 B2 * | 10/2008 | Huang et al. | 525/118 |
| 8,088,546 B2 * | 1/2012 | Takei et al. | 430/270.1 |
| 8,722,311 B2 * | 5/2014 | Yukawa et al. | 430/280.1 |
| 2006/0134547 A1 * | 6/2006 | Huang et al. | 430/270.1 |
| 2008/0097032 A1 * | 4/2008 | Ito et al. | 525/185 |

FOREIGN PATENT DOCUMENTS

| | | |
|---|---|---|
| JP | A 4-75384 | 3/1992 |
| JP | A 4-352101 | 12/1992 |
| JP | A 8-53517 | 2/1996 |
| JP | A 10-142799 | 5/1998 |
| JP | A 11-84663 | 3/1999 |
| JP | A 2000-19732 | 1/2000 |
| JP | A 2005-114968 | 4/2005 |
| JP | A 2005-292279 | 10/2005 |
| JP | A 2006-113136 | 4/2006 |
| JP | A 2006-154403 | 6/2006 |
| JP | A 2007-86479 | 4/2007 |
| JP | A 2007-254495 | 10/2007 |
| JP | A 2008-115148 | 5/2008 |
| WO | WO 2006003850 A1 * | 1/2006 |

OTHER PUBLICATIONS

International Search Report issued for International Application No. PCT/JP2008/058860 on Aug. 19, 2008 (with translation).

* cited by examiner

*Primary Examiner* — John Chu
(74) *Attorney, Agent, or Firm* — Oliff PLC

(57) ABSTRACT

A material for a microlens having heat resistance, high resolution and high light-extraction efficiency is provided. A positive resist composition comprises an alkali-soluble polymer containing a unit structure having an aromatic fused ring or a derivative thereof, and a compound having an organic group which undergoes photodecomposition to yield an alkali-soluble group. The positive resist composition has coating film properties of a refractive index at a wavelength of 633 nm of 1.6 or more and a transmittance at wavelengths of 400 to 730 nm of 80% or more. A pattern forming method comprises applying the positive resist composition, drying the composition, exposing the composition to light, and developing the composition.

10 Claims, No Drawings

PHOTOSENSITIVE RESIN AND PROCESS FOR PRODUCING MICROLENS

TECHNICAL FIELD

The present invention relates to a resist composition containing a copolymer having vinylnaphthalene, and a planarized film and microlens using the same.

BACKGROUND ART

Since a microlens for an imaging device such as a charge coupled device (CCD) can form mainly fine patterns, the microlens can produce a high-definition imaging device, so that the microlens is produced using a method of forming patterns by a photoresist. In this method, by applying a resist composition containing a polymer resin and a sensitizer on a substrate to make a film and then by patterning and developing by a photolithogaraphic method, one pattern is formed to produce a microlens. Generally, the related-art material has no heat resistance sufficient for the application of the digital still camera.

There is disclosed a resist material using a polymer having as a repeating unit, hydroxystyrene, hydroxyvinylnaphthalene or hydroxyanthracene in which hydrogen atoms of hydroxy groups are partially replaced by acid unstable groups (see Patent Document 1).

There is disclosed a high refractive index resin for optical materials having heat resistance and containing a copolymer obtained by copolymerizing 2-vinylnaphtalene with a single type or a plurality of types of vinyl-based monomer capable of being radical-polymerized (see Patent Document 2).

[Patent Document 1]
Japanese Patent Application Publication No. JP-A-2005-114968
[Patent Document 2]
Japanese Patent Application Publication No. JP-A-8-53517

DISCLOSURE OF THE INVENTION

Problems to be Solved by the Invention

When a coating film is formed using a resist composition containing a polymer having a ring structure in which an aromatic ring or an aromatic fused ring is substituted with a hydroxy group, a cured film obtained by subjecting the coating film to heat treatment is colored, so that a satisfactorily transparent film cannot be obtained.

The present invention provides a material for a microlens satisfying requirements for both heat resistance and resolution, using a resist composition containing a copolymer having vinylnaphthalene.

In addition, the structure of an LED package has a bombshell type and a surface mounting type. In a bombshell-type LED package, an LED chip is mounted in a cup integrated with a lead frame, and around the cup, an epoxy resin is molded into a bombshell type. The epoxy resin of a related-art material has a low refractive index of 1.6 or less, so that the related-art material has no satisfactorily high light-extraction efficiency. The present invention provides a material having high light-extraction efficiency using a resist composition containing a copolymer having vinylnaphthalene.

Means for Solving the Problems

The present invention provides, according to a first aspect, a positive resist composition containing an alkali-soluble polymer (A) containing a unit structure having an aromatic fused ring or a derivative thereof and a compound (B) having an organic group which undergoes photodecomposition to yield an alkali-soluble group;

according to a second aspect, the positive resist composition according to the first aspect, in which the polymer (A) is a polymer containing a unit structure represented by Formula (1):

[Chemical Formula 1]

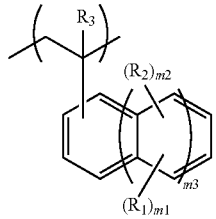

Formula (1)

(in Formula (1), $R_1$ represents a halogen atom, an alkyl group, an alkoxy group, a thiol group, a cyano group, an amino group, an amide group, an alkylcarbonyl group or a thioalkyl group, $R_2$ represents a carboxyl group, $R_3$ represents a hydrogen atom or a methyl group, m3 represents an integer of 1 or 2, when m3=1, m2 represents an integer of 1 to 7, and m1 represents an integer satisfying $0 \le m1 \le (7-m2)$, and when m3=2, m2 represents an integer of 1 to 9, and m1 represents an integer satisfying $0 \le m1 \le (9-m2)$); in which when the total number of unit structures constituting the polymer (A) is assumed to be 1.0, the ratio of the number n1 of unit structures represented by Formula (1) satisfies $0.3 \le n1 \le 1.0$;

according to a third aspect, the positive resist composition according to the first aspect, in which the polymer (A) is a polymer containing a unit structure represented by Formula (2):

[Chemical Formula 2]

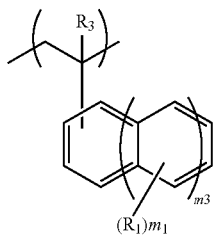

Formula (2)

(in Formula (2), $R_1$ and $R_3$ are the same as defined in Formula (1), m3 represents an integer of 1 or 2, when m3=1, m1 represents an integer of 0 to 7, when m3=2, m1 represents an integer of 0 to 9), and a unit structure represented by Formula (3):

[Chemical Formula 4]

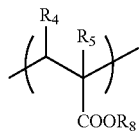

Formula (4)

(in Formula (3), $R_4$ and $R_5$ individually represent a hydrogen atom, a methyl group, a carboxyl group or an alkylenecarboxyl group having 1 to 3 carbon atom(s), Q represents a single bond, an alkylene group having 1 to 3 carbon atom(s) or an aromatic group having 6 to 10 carbon atoms); in which when the total number of all unit structures constituting the polymer (A) is assumed to be 1.0, the ratio of the number n2 of unit structures represented by Formula (2) and the ratio of the number n3 of unit structures represented by Formula (3) satisfy $0.2 \leq n2 \leq 0.8$, $0.1 \leq n3 \leq 0.7$, and $0.3 \leq n2+n3 \leq 1.0$;

according to a fourth aspect, the positive resist composition according to the first aspect, in which the polymer (A) is a polymer containing besides a unit structure represented by Formula (1), a unit structure represented by Formula (4):

[Chemical Formula 4]

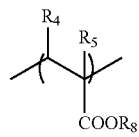

Formula (4)

(in Formula (4), $R_4$ and $R_5$ individually represent a hydrogen atom, a methyl group, a carboxyl group or an alkylenecarboxyl group having 1 to 3 carbon atom(s), $R_8$ represents an unsubstituted or substituted alkyl group having 1 to 10 carbon atom(s), a hydroxyalkyl group having 1 to 6 carbon atom(s), an epoxy group having 3 to 6 carbon atoms, an aromatic group having 6 to 20 carbon atoms or a combination thereof), a unit structure represented by Formula (5):

[Chemical Formula 5]

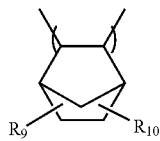

Formula (5)

(in Formula (5), $R_9$ and $R_{10}$ individually represent unsubstituted or substituted alkyl group having 1 to 10 carbon atom(s), a hydroxyalkyl group having 1 to 6 carbon atom(s), a hydroxyl group, a halogen atom, a carboxyl group or an alkoxy group having 1 to 10 carbon atom(s)), or a unit structure containing a combination of unit structures represented by Formula (4) and Formula (5); in which when the total number of all unit structures constituting the polymer (A) is assumed to be 1.0, the ratio of the number n1 of unit structures represented by Formula (1) satisfies $0.3 \leq n1 \leq 0.7$, when the polymer (A) contains the unit structure represented by Formula (1) and the unit structure represented by Formula (4), the ratio of the number n4 of unit structures satisfies $0 \leq n4 \leq 0.4$, when the polymer (A) contains the unit structure represented by Formula (1) and the unit structure represented by Formula (5), the ratio of the number n5 of unit structures satisfies $0 \leq n5 \leq 0.4$, and when the polymer (A) contains the unit structure represented by Formula (1) and the combination of unit structures represented by Formula (4) and Formula (5), the number n4+n5 of unit structures satisfies $0 \leq n4+n5 \leq 0.4$ and $0.3 \leq n1+n4+n5 \leq 1.0$;

according to a fifth aspect, the positive resist composition according to the first aspect, in which the polymer (A) is a polymer containing besides a unit structure represented by Formula (2) and a unit structure represented by Formula (3), a unit structure represented by Formula (4), a unit structure represented by Formula (5) or a unit structure containing a combination of unit structures represented by Formula (4) and Formula (5); in which when the total number of all unit structures constituting the polymer (A) is assumed to be 1.0, the ratio of the number n2 of unit structures represented by Formula (2) and the ratio of the number n3 of unit structures represented by Formula (3) satisfy $0.2 \leq n2 \leq 0.8$ and $0.1 \leq n3 \leq 0.7$, respectively, when the polymer (A) contains the unit structure represented by Formula (2), the unit structure represented by Formula (3) and the unit structure represented by Formula (4), the ratio of the number n4 of unit structures satisfies $0 \leq n4 \leq 0.4$, when the polymer (A) contains the unit structure represented by Formula (2), the unit structure represented by Formula (3) and the unit structure represented by Formula (5), the ratio of the number n5 of unit structures satisfies $0 \leq n5 \leq 0.4$, and when the polymer (A) contains the unit structure represented by Formula (2), the unit structure represented by Formula (3), the unit structure represented by Formula (4) and the unit structure represented by Formula (5), the number n4+n5 of unit structures satisfies $0 \leq n4+n5 \leq 0.4$ and $0.3 \leq n2+n3+n4+n5 \leq 1.0$;

according to a sixth aspect, the positive resist composition according to any one of the first aspect to the fifth aspect, in which the compound (B) has a structure represented by Formula (6):

[Chemical Formula 6]

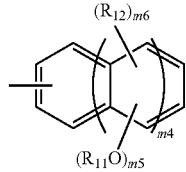

Formula (6)

(in Formula (6), $R_{11}$ represents a hydrogen atom, a 1,2-quinonediazide group or a derivative thereof, $R_{12}$ represents an unsubstituted or substituted alkyl group having 1 to 10 carbon atom(s), a halogen atom or an alkoxy group having 1 to 10 carbon atom(s), m4 represents an integer of 0 or 1, when m4 is 0, m5 represents an integer of 1 to 5 and m6 represents an integer satisfying 0≤m6≤(5−m5), when m4 is 1, m5 represents an integer of 1 to 7 and m6 represents an integer satisfying 0≤m6≤(7−m5), and in all —$OR_{11}$ groups existing in the compound (B), $R_{11}$ is a 1,2-quinonediazide group or a derivative thereof in an amount of 10 to 98 mol %);

according to a seventh aspect, the positive resist composition according to any one of the first aspect to the fifth aspect, in which the compound (B) has a structure represented by Formula (7):

[Chemical Formula 7]

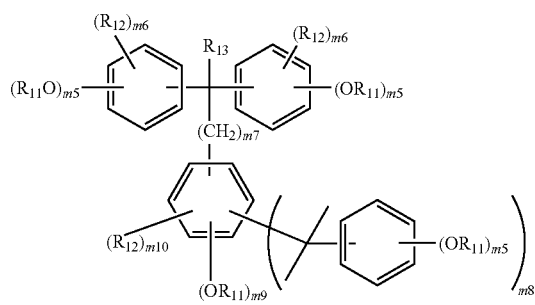

Formula (7)

(in Formula (7), $R_{11}$ and $R_{12}$ are the same as defined in Formula (6), $R_{13}$ represents a hydrogen atom or an alkyl group having 1 to 10 carbon atom(s), m5 represents an integer of 1 to 5, m6 represents an integer satisfying 0≤m6≤(5−m5), m10 represents an integer satisfying 0≤m10≤(5−m8−m9), m7 represents an integer of 0 to 10, m8 represents an integer of 0 or 1, m9 represents an integer of 0 to 5, and in all —$OR_{11}$ groups existing in the compound (B), $R_{11}$ is a 1,2-quinonediazide group or a derivative thereof in an amount of 10 to 98 mol %);

according to an eighth aspect, the positive resist composition according to the sixth aspect or the seventh aspect, in which in each of the compounds (B) represented by Formula (6) and Formula (7), $R_{11}$ in the formulae is represented by Formula (8):

[Chemical Formula 8]

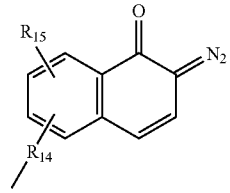

Formula (8)

(in Formula (8), $R_{14}$ represents a single bond or —$SO_3$— group, $R_{15}$ represents a hydrogen atom or an alkyl group having 1 to 10 carbon atom(s));

according to a ninth aspect, the positive resist composition according to any one of the first aspect to the eighth aspect, having coating film properties of a refractive index at a wavelength of 633 nm of 1.6 or more and a transmittance at wavelengths of 400 to 730 nm of 80% or more;

according to a tenth aspect, a pattern forming method including applying the positive resist composition as described in any one of the first aspect to the ninth aspect on a substrate, drying the composition, exposing the composition to light, and developing the composition;

according to an eleventh aspect, a pattern forming method including applying the positive resist composition as described in any one of the first aspect to the ninth aspect on a substrate, drying the composition, exposing the composition to light, and developing the composition;

according to a twelfth aspect, an LED display device including a planarized film formed by the method as described in the tenth aspect; and according to a thirteenth aspect, a solid-state imaging device including a microlens formed by the method as described in the tenth aspect.

Effects of the Invention

The positive resist composition of the present invention can form a coating film having high heat resistance and high resolution, and a cured film formed by subjecting the coating film to heat treatment has high transparency and can be suitably used as a material for a microlens.

In the present invention, on a photodiode (photosensor element) formed on a substrate, an interlayer insulating layer is formed and on the top thereof, a protective film is formed. On the protective film, a color filter layer including R/G/B is formed. On the color filter, a planarized film is formed and on the top thereof, a microlens is formed. The positive resist composition of the present invention can be used for forming the planarized film and the microlens.

An image sensor is a semiconductor device for converting an optical image into an electrical signal. A CMOS image sensor is constituted with a photodiode sensing light radiated and a part converting the sensed light into an electrical signal. The sensitivity of an image sensor to light increases as an amount of light received by the photodiode increases. As one of light condensing techniques for increasing the amount of light received, there is a method of forming a microlens. This method includes: producing a convex microlens with a substance having a high light-transmittance on the top of a photodiode; and refracting a path of incident light by the microlens to condense a large amount of light on the photodiode. In this case, light parallel to an optical axis of the microlens is refracted by the microlens and the refracted light is focused on a predetermined position on the optical axis to convert an image into an electrical signal.

For this microlens, a material having high transparency and a high refractive index is required. In addition, factors of the microlens such as a curvature and a formed height are determined by taking into consideration the focus of focused light and the factors have an influence on a light-condensing efficiency, however, for forming such a microlens, a positive photosensitive material (resist material) is used. In other words, by applying a positive resist composition on a planarized layer and by drying the composition, a positive resist layer is formed and by exposure and development, a positive resist pattern is formed. Subsequently, by thermal reflow or the like, a convex microlens is formed.

In addition, a planarized layer existing as an underlayer of the microlens also plays an important role for forming a uniform optical axis of the microlens by forming a uniform surface of the planarized layer. Also, for condensing more light on a photodiode, a planarized layer having a high refractive index and high transparency is required.

The present invention can provide a material for microlens having a high refractive index, high transparency and advantageous reflow properties and a planarized film material for forming a microlens, by using vinylnaphthalene or derivatives thereof.

The coating film obtained according to the present invention has such coating film properties as a refractive index at a wavelength of 633 nm of 1.6 or more and a transmittance at wavelengths of 400 to 730 nm of 80% or more.

The present invention can provide a material suitable as an LED material, which has a refractive index at a wavelength of 633 nm of 1.6 or more.

BEST MODES FOR CARRYING OUT THE INVENTION

The positive resist composition of the present invention contains an alkali-soluble polymer (A) containing a unit structure having an aromatic fused ring or derivatives thereof and a compound (B) having an organic group which undergoes photodecomposition to yield an alkali-soluble group. Then, this positive resist composition is produced by dissolving the polymer (A) and the compound (B) in a solvent (C), and can optionally contain a crosslinkable compound (D), a surfactant (E) and an adhesion accelerator (F). The solid content of the positive resist composition of the present invention is 3 to 50% by mass, preferably 5 to 35% by mass, more preferably 7 to 30% by mass, based on the total mass of the composition. The solid content means a ratio of a component that remains after removing a solvent from the positive resist composition.

The content of the polymer (A) in the above solid content is 10 to 90% by mass, preferably 40 to 90% by mass, more preferably 50 to 80% by mass. In addition, the content of the compound (B) in the solid content is 1 to 90% by mass, preferably 5 to 50% by mass, more preferably 10 to 30% by mass.

When the ratio of the compound (B) is the lower limit value of this range or less, the difference in the solubility in a developer between an exposed part and an unexposed part is small, so that the patterning by the development may be difficult. On the other hand, when the ratio of the compound (B) is more than the upper limit value of this range, a 1,2-quinonediazide compound may not be satisfactorily decomposed by an exposure of a short time to lower the sensitivity, or the compound (B) may absorb light to lower transparency of a cured film.

In the present invention, the alkali-soluble polymer (A) containing a unit structure having an aromatic fused ring or derivatives thereof is used.

Examples of a monomer forming a unit structure having an aromatic fused ring include vinylnaphthalene, vinylanthracene and derivatives thereof.

There are such cases that the polymer (A) has an alkali-soluble chemical group (that is, a carboxyl group) in a unit structure having an aromatic fused ring and that the polymer (A) has an alkali-soluble chemical group (that is, a carboxyl group) in a unit structure other than the unit structure having an aromatic fused ring.

The polymer (A) used in the present invention has a number average molecular weight of 2,000 to 30,000, preferably 2,500 to 15,000, more preferably 3,000 to 10,000.

As the polymer (A) used in the present invention, a polymer having a unit structure represented by Formula (1) in which when the total number of unit structures constituting the polymer (A) containing the unit structure represented by Formula (1) is assumed to be 1.0, the ratio of the number n1 of unit structures represented by Formula (1) satisfies $0.3 \leq n1 \leq 1.0$ can be used. In Formula (1), $R_1$ is a halogen atom, an alkyl group, an alkoxy group, a thiol group, a cyano group, an amino group, an amide group, an alkylcarbonyl group or a thioalkyl group; $R_2$ is a carboxyl group; and $R_3$ is a hydrogen atom or a methyl group. m3 is an integer of 1 or 2 and when m3=1, m2 is an integer of 1 to 7 and m1 is an integer satisfying $0 \leq m1 \leq (7-m2)$. Then, when m3=2, m2 is an integer of 1 to 9 and m1 is an integer satisfying $0 \leq m1 \leq (9-m2)$. When m3=1, the aromatic fused ring represents a naphthalene ring and when m3=2, it represents an anthracene ring. The substituent $R_2$ exists essentially in the number of 1 or more in the ring and can be contained up to the maximum number of substitutable substituents of the ring. The substituent $R_1$ is optionally contained and can be contained in any number from 0 to the maximum number of substitutable substituents of the ring except the number of substituents $R_2$. There is a case in which the total number of the substituents $R_1$ and $R_2$ is less than the maximum number of substitutable substituents of the ring. That is, there exist substitutable hydrogen atoms in the ring.

Examples of the halogen atom include a fluorine atom, a chlorine atom, a bromine atom and an iodine atom.

The alkyl group is an alkyl group having 1 to 10 carbon atom(s) and examples thereof include a methyl group, an ethyl group, an n-propyl group, an isopropyl group, a cyclopropyl group, an n-butyl group, an isobutyl group, an sec-butyl group, a tert-butyl group, a cyclobutyl group, a 1-methyl-cyclopropyl group, a 2-methyl-cyclopropyl group, an n-pentyl group, a 1-methyl-n-butyl group, a 2-methyl-n-butyl group, a 3-methyl-n-butyl group, a 1,1-dimethyl-n-propyl group, an 1,2-dimethyl-n-propyl group, a 2,2-dimethyl-n-propyl group, a 1-ethyl-n-propyl group, a cyclopentyl group, a 1-methyl-cyclobutyl group, a 2-methyl-cyclobutyl group, a 3-methyl-cyclobutyl group, an 1,2-dimethyl-cyclopropyl group, a 2,3-dimethyl-cyclopropyl group, a 1-ethyl-cyclopropyl group, a 2-ethyl-cyclopropyl group, an n-hexyl group, a 1-methyl-n-pentyl group, a 2-methyl-n-pentyl group, a 3-methyl-n-pentyl group, a 4-methyl-n-pentyl group, a 1,1-dimethyl-n-butyl group, a 1,2-dimethyl-n-butyl group, a 1,3-dimethyl-n-butyl group, a 2,2-dimethyl-n-butyl group, a 2,3-dimethyl-n-butyl group, a 3,3-dimethyl-n-butyl group, a 1-ethyl-n-butyl group, a 2-ethyl-n-butyl group, a 1,1,2-trimethyl-n-propyl group, a 1,2,2-trimethyl-n-propyl group, a 1-ethyl-1-methyl-n-propyl group, a 1-ethyl-2-methyl-n-propyl group, a cyclohexyl group, a 1-methyl-cyclopentyl group, a 2-methyl-cyclopentyl group, a 3-methyl-cyclopentyl group, a 1-ethyl-cyclobutyl group, a 2-ethyl-cyclobutyl group, a 3-ethyl-cyclobutyl group, a 1,2-dimethyl-cyclobutyl group, a 1,3-dimethyl-cyclobutyl group, a 2,2-dimethyl-cyclobutyl group, a 2,3-dimethyl-cyclobutyl group, a 2,4-dimethyl-cyclobutyl group, a 3,3-dimethyl-cyclobutyl group, a 1-n-propyl-cyclopropyl group, a 2-n-propyl-cyclopropyl group, a 1-isopropyl-cyclopropyl group, a 2-isopropyl-cyclopropyl group, a 1,2,2-trimethyl-cyclopropyl group, a 1,2,3-trimethyl-cyclopropyl group, a 2,2,3-trimethyl-cyclopropyl group, a 1-ethyl-2-methyl-cyclopropyl group, a 2-ethyl-1-methyl-cyclopropyl group, a 2-ethyl-2-methyl-cyclopropyl group and a 2-ethyl-3-methyl-cyclopropyl group.

The alkoxy group is an alkoxy group having 1 to 10 carbon atom(s) and examples thereof include a methoxy group, an ethoxy group, an n-propoxy group, an isopropoxy group, an n-butoxy group, an isobutoxy group, a sec-butoxy group, a tert-butoxy group, an n-pentoxy group, a 1-methyl-n-butoxy group, a 2-methyl-n-butoxy group, a 3-methyl-n-butoxy group, a 1,1-dimethyl-n-propoxy group, a 1,2-dimethyl-n-propoxy group, a 2,2-dimethyl-n-propoxy group, a 1-ethyl-n-propoxy group, an n-hexyloxy group, a 1-methyl-n-pentyloxy group, a 2-methyl-n-pentyloxy group, a 3-methyl-n-pentyloxy group, a 4-methyl-n-pentyloxy group, a 1,1-dimethyl-n-butoxy group, a 1,2-dimethyl-n-butoxy group, a 1,3-dimethyl-n-butoxy group, a 2,2-dimethyl-n-butoxy group, a 2,3-dimethyl-n-butoxy group, a 3,3-dimethyl-n-butoxy group, a 1-ethyl-n-butoxy group, a 2-ethyl-n-butoxy group, a 1,1,2-trimethyl-n-propoxy group, a 1,2,2-trimethyl-n-propoxy group, a 1-ethyl-1-methyl-n-propoxy group and a 1-ethyl-2-methyl-n-propoxy group.

As the amino group, besides $-NH_2$, for example an amino group having 1 to 10 carbon atom(s) can be used and examples thereof include a methylamino group, an ethylamino group, an n-propylamino group, an isopropylamino group, a cyclopropylamino group, an n-butylamino group, an isobutylamino group, a sec-butylamino group, a tert-butylamino group, a cyclobutylamino group, a 1-methyl-cyclopropylamino group, a 2-methyl-cyclopropylamino group, an n-pentylamino group, a 1-methyl-n-butylamino group, a 2-methyl-n-butylamino group, a 3-methyl-n-butylamino group and a 1,1-dimethyl-n-propylamino group.

As the amide group, for example an amide group having 1 to 10 carbon atom(s) can be used and examples thereof include chemical groups such as a hexaneamide group, a succinamide group, a benzenesulfonamide group and an N-hydroxyacetamide group.

Examples of the alkylcarbonyl group include alkylcarbonyl groups having 1 to 10 carbon atom(s) such as a methylcarbonyl group, an ethylcarbonyl group, an n-propylcarbonyl group, an isopropylcarbonyl group, a cyclopropylcarbonyl group, an n-butylcarbonyl group, an isobutylcarbonyl group, a sec-butylcarbonyl group, a tert-butylcarbonyl group, a cyclobutylcarbonyl group, a 1-methyl-cyclopropylcarbonyl group, a 2-methyl-cyclopropylcarbonyl group, an n-pentylcarbonyl group, a 1-methyl-n-butylcarbonyl group, a 2-methyl-n-butylcarbonyl group, a 3-methyl-n-butylcarbonyl group, a 1,1-dimethyl-n-propylcarbonyl group, a 1,2-dimethyl-n-propylcarbonyl group, a 2,2-dimethyl-n-propylcarbonyl group, a 1-ethyl-n-propylcarbonyl group, a cyclopentylcarbonyl group, a 1-methyl-cyclobutylcarbonyl group, a 2-methyl-cyclobutylcarbonyl group, a 3-methyl-cyclobutylcarbonyl group, a 1,2-dimethyl-cyclopropylcarbonyl group, a 2,3-dimethyl-cyclopropylcarbonyl group, a 1-ethyl-cyclopropylcarbonyl group, a 2-ethyl-cyclopropylcarbonyl group, an n-hexylcarbonyl group, a 1-methyl-n-pentylcarbonyl group, a 2-methyl-n-pentylcarbonyl group, a 3-methyl-n-pentylcarbonyl group, a 4-methyl-n-pentylcarbonyl group, a 1,1-dimethyl-n-butylcarbonyl group, a 1,2-dimethyl-n-butylcarbonyl group, a 1,3-dimethyl-n-butylcarbonyl group, a 2,2-dimethyl-n-butylcarbonyl group, a 2,3-dimethyl-n-butylcarbonyl group, a 3,3-dimethyl-n-butylcarbonyl group, a 1-ethyl-n-butyl carbonyl group, a 2-ethyl-n-butylcarbonyl group, a 1,1,2-trimethyl-n-propylcarbonyl group, a 1,2,2-trimethyl-n-propylcarbonyl group, a 1-ethyl-1-methyl-n-propylcarbonyl group, a 1-ethyl-2-methyl-n-propylcarbonyl group, a cyclohexylcarbonyl group, a 1-methyl-cyclopentylcarbonyl group, a 2-methyl-cyclopentylcarbonyl group, a 3-methyl-cyclopentylcarbonyl group, a 1-ethyl-cyclobutylcarbonyl group, a 2-ethyl-cyclobutylcarbonyl group, a 3-ethyl-cyclobutylcarbonyl group, a 1,2-dimethyl-cyclobutylcarbonyl group, a 1,3-dimethyl-cyclobutylcarbonyl group, a 2,2-dimethyl-cyclobutylcarbonyl group, a 2,3-dimethyl-cyclobutylcarbonyl group, a 2,4-dimethyl-cyclobutylcarbonyl group, a 3,3-dimethyl-cyclobutylcarbonyl group, a 1-n-propyl-cyclopropylcarbonyl group, a 2-n-propyl-cyclopropylcarbonyl group, a 1-isopropyl-cyclopropylcarbonyl group, a 2-isopropyl-cyclopropylcarbonyl group, a 1,2,2-trimethyl-cyclopropylcarbonyl group, a 1,2,3-trimethyl-cyclopropylcarbonyl group, a 2,2,3-trimethyl-cyclopropylcarbonyl group, a 1-ethyl-2-methyl-cyclopropylcarbonyl group, a 2-ethyl-1-methyl-cyclopropylcarbonyl group, a 2-ethyl-2-methyl-cyclopropylcarbonyl group and a 2-ethyl-3-methyl-cyclopropylcarbonyl group.

Examples of the thioalkyl group include thioalkyl groups having 1 to 10 carbon atom(s) such as an ethylthio group, a butylthio group, a hexylthio group and an octylthio group.

In addition, the polymer (A) used in the present invention has a unit structure represented by Formula (2) and a unit structure represented by Formula (3). As the polymer (A), a polymer in which when the total number of all unit structures constituting the polymer (A) is assumed to be 1.0, the ratio of the number n2 of unit structures represented by Formula (2) satisfies $0.2 \leq n2 \leq 0.8$, the ratio of the number n3 of unit structures represented by Formula (3) satisfies $0.1 \leq n2 \leq 0.7$, and the both satisfy $0.3 \leq n2+n3 \leq 1.0$, can be used. In Formula (2), $R_1$ and $R_3$ are the same as defined in Formula (1); and m3 is an integer of 1 or 2 and when m3=1, m1 is an integer of 0 to 7 and when m3=2, m1 is an integer of 0 to 9. The substituent $R_1$ is optionally contained and can be contained in any number from 0 to the maximum number of substitutable substituents of the ring. There is a case in which the number of $R_1$ is less than the maximum number of substitutable substituents of the ring. That is, there exist substitutable hydrogen atoms in the ring.

In Formula (3), $R_4$ and $R_5$ individually represent a hydrogen atom, a methyl group, a carboxyl group or an alkylenecarbonoxyl group having 1 to 3 carbon atom(s), and Q represents a single bond, an alkylene group having 1 to 3 carbon atom(s) or an aromatic group having 6 to 10 carbon atoms. Examples of the alkylene group include a methylene group, an ethylene group and a butylene group. Examples of the aromatic group having 6 to 10 carbon atoms include an unsubstituted and substituted phenyl group, naphthyl group and benzyl group, and examples of a substituent for the substituted groups include an alkyl group and a halogen atom.

Examples of a monomer component for introducing the unit structure represented by Formula (3) include acrylic acid, methacrylic acid, itaconic acid, maleic acid, fumaric acid and vinylbenzoic acid.

In addition, as the polymer (A) used in the present invention, a polymer containing besides the unit structure represented by Formula (1), a unit structure represented by Formula (4), a unit structure represented by Formula (5), or a unit structure represented by Formula (4) and Formula (5) can be used. That is, it is a polymer containing a combination of the unit structure represented by Formula (1) and the unit structure represented by Formula (4), a polymer containing a combination of the unit structure represented by Formula (1) and the unit structure represented by Formula (5), or a polymer containing a combination of the unit structure represented by Formula (1), the unit structure represented by Formula (4) and the unit structure represented by Formula (5).

When the total number of all unit structures constituting the polymer (A) is assumed to be 1.0, the ratio of the number n1 of unit structures represented by Formula (1) satisfies $0.3 \leq n1 \leq 0.7$. When the polymer (A) contains the unit structure represented by Formula (1) and the unit structure represented by Formula (4), the ratio of the number n4 of unit structures satisfies $0 \leq n4 \leq 0.4$, and when the polymer (A) contains the unit structure represented by Formula (1) and the unit structure represented by Formula (5), the ratio of the number n5 of unit structures satisfies $0 \leq n5 \leq 0.4$. When the polymer (A) contains the unit structure represented by Formula (1) and a combination of unit structures represented by Formula (4) and Formula (5), the number n4+n5 of unit structures satisfies $0 \leq n4+n5 \leq 0.4$ and $0.3 \leq n1+n4+n5 \leq 1.0$.

In Formula (4), $R_4$ and $R_5$ individually represent a hydrogen atom, a methyl group, a carboxyl group, an alkylenecarboxyl group having 1 to 3 carbon atom(s), and $R_8$ represents an unsubstituted or substituted alkyl group having 1 to 10 carbon atom(s), a hydroxyalkyl group having 1 to 6 carbon atom(s), an epoxy group having 4 to 6 carbon atoms, an aromatic group having 6 to 10 carbon atoms, or a combination thereof. The alkyl group is the same as those exemplified in Formula (1). Examples of the alkylenecarboxyl group having 1 to 3 carbon atom(s) include —$CH_2COOH$, —$C_2H_4COOH$ and —$C_3C_6COOH$. Examples of the aromatic group having 6 to 20 carbon atoms include an unsubstituted or substituted phenyl group, naphthyl group and benzyl group and examples of a substituent for the substituted groups include an alkyl group and a halogen atom.

Examples of the monomer for introducing the unit structure represented by Formula (4) include alkyl esters such as methyl methacrylate, ethyl methacrylate, n-butyl methacrylate, sec-butyl methacrylate and tert-butyl methacrylate; alkyl esters such as methyl acrylate and isopropyl acrylate; cycloalkyl esters such as cyclohexyl methacrylate, 2-methylcyclohexyl methacrylate, dicyclopentanyloxyethyl methacrylate and isobornyl methacrylate; aryl esters such as phenyl methacrylate and benzyl methacrylate; dicarboxylic acid diesters such as diethyl maleate, diethyl fumarate and diethyl itaconate; hydroxyalkyl esters such as 2-hydroxyethyl methacrylate, 2-hydroxypropyl methacrylate and 2-hydroxyethyl methacrylate; glycidyl acrylate; glycidyl methacrylate; glycidyl α-ethylacrylate; glycidyl α-n-propylacrylate; glycidyl α-n-butylacrylate; 3-4-epoxybutyl acrylate; 3-4-epoxybutyl methacrylate; 6,7-epoxyheptyl acrylate; 6,7-epoxyheptyl methacrylate; 6,7-epoxyheptyl α-ethylacrylate; o-vinylbenzyl glycidyl ether; m-vinylbenzyl glycidyl ether; and p-vinylbenzyl glycidyl ether.

In Formula (5), $R_9$ and $R_{10}$ individually represent an unsubstituted or substituted alkyl group having 1 to 10 carbon atom(s), a hydroxyalkyl group having 1 to 6 carbon atom(s), a hydroxyl group, a halogen atom, a carboxyl group or an alkoxy group having 1 to 10 carbon atom(s). As the alkyl group and the alkoxy group, the same groups as described in Formula (1) can be used.

Examples of the monomer for introducing the unit structure represented by Formula (5) include bicyclo unsaturated compounds such as bicyclo(2.2.1)hept-2-ene, 5-methylbicyclo(2.2.1)hept-2-ene, 5-ethylbicyclo(2.2.1)hept-2-ene, 5-hydroxybicyclo(2.2.1)hept-2-ene, 5-carboxybicyclo(2.2.1)hept-2-ene, 5-hydroxymethylbicyclo(2.2.1)hept-2-ene, 5-(2'-hydroxyethyl)bicyclo(2.2.1)hept-2-ene, 5-methoxybicyclo(2.2.1)hept-2-ene, 5-ethoxybicyclo(2.2.1)hept-2-ene, 5,6-dihydroxybicyclo(2.2.1)hept-2-ene, 5,6-dicarboxybicyclo(2.2.1)hept-2-ene, 5,6-di(hydroxymethyl)bicyclo(2.2.1)hept-2-ene, 5,6-di(2'-hydroxyethyl) bicyclo(2.2.1)hept-2-ene, 5,6-dimethoxybicyclo(2.2.1)hept-2-ene, 5,6-diethyoxybicyclo(2.2.1)hept-2-ene, 5-hydroxy-5-methylbicyclo(2.2.1)hept-2-ene, 5-hydroxy-5-ethylbicyclo(2.2.1)hept-2-ene, 5-carboxy-5-methylbicyclo(2.2.1)hept-2-ene, 5-carboxy-5-ethylbicyclo(2.2.1)hept-2-ene, 5-hydroxymethyl-5-methylbicyclo(2.2.1)hept-2-ene, 5-carboxy-6-methylbicyclo(2.2.1)hept-2-ene, 5-carboxy-6-ethylbicyclo(2.2.1)hept-2-ene, 5,6-dicarboxybicyclo(2.2.1)hept-2-ene anhydride (himic anhydride), 5-tert-butoxycarbonylbicyclo(2.2.1)hept-2-ene, 5-cyclohexyloxycarbonylbicyclo(2.2.1)hept-2-ene, 5-phenoxycarbonylbicyclo(2.2.1)hept-2-ene, 5,6-di(tert-butoxycarbonyl)bicyclo(2.2.1)hept-2-ene and 5,6-di(cyclohexyloxycarbonyl) bicyclo(2.2.1)hept-2-ene.

In addition, the polymer (A) used in the present invention contains besides the unit structure represented by Formula (2) and the unit structure represented by Formula (3), the unit structure represented by Formula (4), the unit structure represented by Formula (5) or the unit structure containing a combination of the unit structures represented by Formula (4) and Formula (5). That is, examples of the polymer (A) include a polymer containing the unit structure represented by Formula (2), the unit structure represented by Formula (3) and the unit structure represented by Formula (4), a polymer containing the unit structure represented by Formula (2), the unit structure represented by Formula (3) and the unit structure represented by Formula (5), and a polymer containing the unit structure represented by Formula (2), the unit structure represented by Formula (3), the unit structure represented by Formula (4) and the unit structure represented by Formula (5).

When the total number of all unit structures constituting the polymer (A) is assumed to be 1.0, the ratio of the number n2 of unit structures represented by Formula (2) satisfies $0.2 \leq n2 \leq 0.8$ and the ratio of the number n3 of unit structures represented by Formula (3) satisfies $0.1 \leq n3 \leq 0.7$. When the polymer (A) contains the unit structure represented by Formula (2), the unit structure represented by Formula (3) and the unit structure represented by Formula (4), the ratio of the number n4 of unit structures satisfies $0 \leq n4 \leq 0.4$, and when the polymer (A) contains the unit structure represented by Formula (2), the unit structure represented by Formula (3) and the unit structure represented by Formula (5), the ratio of the number n5 of unit structures satisfies $0 \leq n5 \leq 0.4$. Further, when the polymer (A) contains the unit structure represented by Formula (2), the unit structure represented by Formula (3), the unit structure represented by Formula (4) and the unit structure represented by Formula (5), the number n4+n5 of unit structures satisfies $0 \leq n4+n5 \leq 0.4$ and $0.3 \leq n2+n3+n4+n5 \leq 1.0$.

Examples of the polymer containing the unit structure represented by Formula (1), and the polymer containing the unit structures represented by Formula (1) and Formula (3) or Formula (4) include polymers represented by the following formulae:

[Chemical Formula 9]
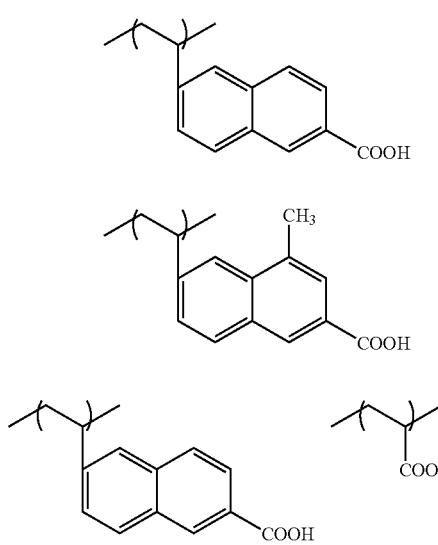  (1-1)
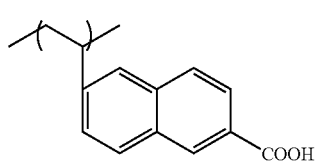  (1-2)
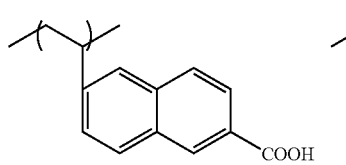  (1-3)
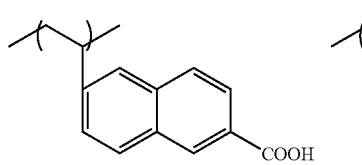  (1-4)
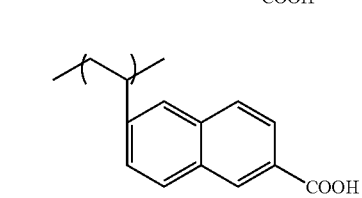  (1-5)
In addition, examples of the polymer containing the unit structure represented by Formula (2), the unit structure represented by Formula (3), or the unit structures represented by Formula (2), Formula (3) and Formula (4) and/or Formula (5) include polymers represented by the following formulae:
[Chemical Formula 10]
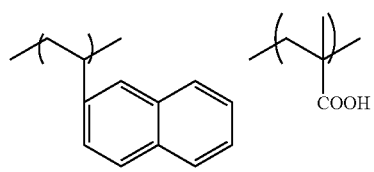  (2-1)
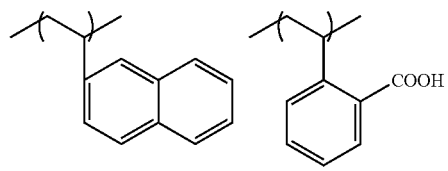  (2-2)
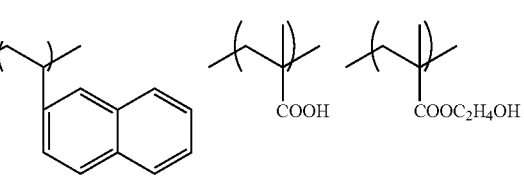  (2-3)
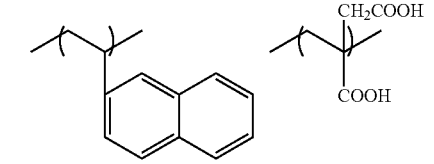  (2-4)
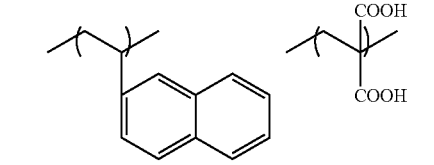  (2-5)
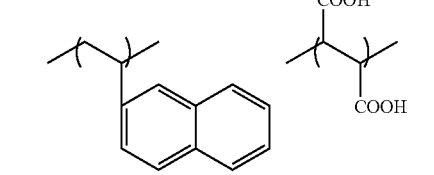  (2-6)
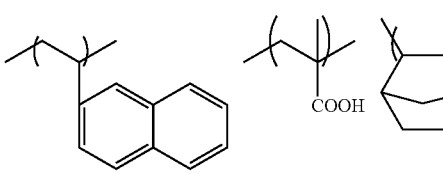  (2-7)
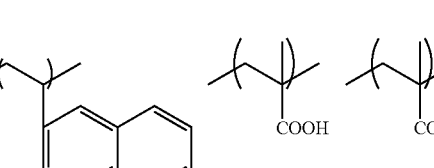  (2-8)
[Chemical Formula 11]
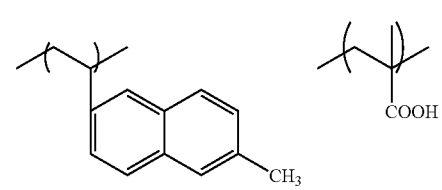  (2-9)

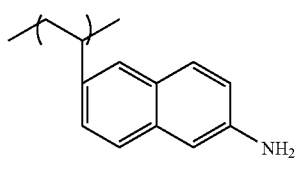 (2-10)
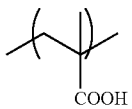

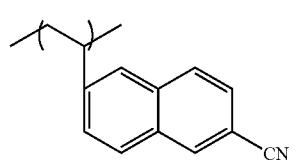 (2-11)
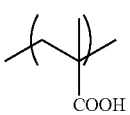

The polymer (A) used in the present invention can be produced by copolymerizing any unsaturated monomers other than the above monomers. Examples of the unsaturated monomer include acrylamide compounds such as acrylamide, N-methylacrylamide, N-ethylacrylamide, N-benzylacrylamide, N-phenylacrylamide and N,N-dimethylacrylamide.

Examples of the unsaturated monomer also include methacrylamide compounds such as methacrylamide, N-methylmethacrylamide, N-ethylmethacrylamide, N-benzylmethacrylamide, N-phenylmethacrylamide and N,N-dimethylmethacrylamide. Examples of the unsaturated monomer also include styrene compounds such as styrene, methylstyrene, chlorostyrene, bromostyrene and hydroxystyrene.

Examples of the unsaturated monomer also include maleimide compounds such as maleimide, N-methylmaleimide, N-phenylmaleimide and N-cyclohexylmaleimide.

The method for obtaining the polymer (A) used in the present invention is not particularly limited. Generally, the polymer (A) is produced by radical-polymerizing a monomer which is the above-described species of monomers used for obtaining the polymer (A) in a polymerization solvent. In addition, if necessary, the monomer in which functional groups of the monomer are protected may be polymerized, followed by subjecting the protected functional group to deprotection treatment.

Examples of the polymerization solvent include: alcohols such as methanol, ethanol, propanol and butanol; ethers such as tetrahydrofuran and dioxane; aromatic hydrocarbons such as benzene, toluene and xylene; polar solvents such as N,N-dimethylformamide and N-methyl-2-pyrrolidone; esters such as ethyl acetate, butyl acetate and ethyl lactate; alkoxy esters such as methyl 3-methoxypropionate, methyl 2-methoxypropionate, ethyl 3-methoxypropionate, ethyl 2-methoxypropionate, ethyl 3-ethoxypropionate and ethyl 2-ethoxypropionate; ethers such as ethylene glycol dimethyl ether, diethylene glycol dimethyl ether, diethylene glycol diethyl ether, diethylene glycol methylethyl ether, propylene glycol dimethyl ether and dipropylene glycol dimethyl ether; glycol dialkyl esters; glycol monoalkyl ethers such as ethylene glycol monomethyl ether, ethylene glycol monoethyl ether, diethylene glycol monomethyl ether, diethylene glycol monoethyl ether, propylene glycol monomethyl ether, propylene glycol monoethyl ether, dipropylene glycol monomethyl ether and dipropylene glycol monoethyl ether; glycol monoalkyl ether esters such as propylene glycol monomethyl ether acetate, carbitol acetate and ethyl cellosolve acetate; and ketones such as cyclohexanone, methyl ethyl ketone, methyl isobutyl ketone and 2-heptanone. These polymerization solvents may be used individually or in combination of two or more types thereof. Among them, from the viewpoint of the safety for the global environment and a work environment, preferred are propylene glycol monomethyl ether, propylene glycol monomethyl ether acetate and ethyl lactate.

The compound (B) having an organic group which undergoes photodecomposition to yield an alkali-soluble group and used in the present invention is a compound containing an organic group (B1) which undergoes photodecomposition to yield an alkali-soluble group and a chemical group (B2) thermally crosslinkable with a crosslinkable compound (D).

In the present invention, when the compound (B) is applied as a component of the positive resist composition and is cured by heating, the thermally-crosslinkable chemical group (B2) can be also reacted with a crosslinking-reaction forming group (such as an epoxy group and an alkoxyalkyl group) of the crosslinkable compound (D) to form a crosslinkage structure. Then, a coating film coated with the positive resist composition is exposed to light using a photomask and is developed. At this time, the organic group (B1) which undergoes photodecomposition to yield an alkali-soluble group is converted into a carboxyl group and becomes soluble in a developer (an alkaline aqueous solution), so that an exposed part is dissolved in the developer to form a positive resist pattern.

Representative examples of the organic group (B1) which undergoes photodecomposition to yield an alkali-soluble group include a 1,2-naphthoquinonediazide group and derivatives thereof. The 1,2-naphthoquinonediazide group is converted into a ketene by receiving light irradiation and the generated ketene is, due to its high reactivity, contacted with moisture to form a carboxyl group. In other words, the 1,2-naphthoquinonediazide group generates an indene carboxylic acid by exposure and development to become soluble in a developer. In addition, for suppressing the influence of a standing wave on a pattern form or for controlling the crosslinking degree with the crosslinkable compound (D), a post exposure bake (PEB) can be performed.

For forming a resin crosslinked by a thermal crosslinking reaction with the crosslinkable compound (D), the compound (B) containing a 1,2-naphthoquinonediazide group can be bonded to a crosslinkable compound through the thermally-crosslinkable chemical group (B2). Examples of the chemical group (B2) include a hydroxyl group, an amino group and a carboxyl group, and among them, particularly preferred is a hydroxyl group. A hydroxyl group can be contained in a 1,2-naphthoquinonediazide group, however, for forming a crosslinkage structure, it is preferred that the compound (B) has a hydroxyl group. Therefore, a method of generating the compound (B) by reacting a compound (B1) having a 1,2-naphthoquinonediazide group with a compound (B2) having a hydroxyl group is used.

The compound (B) has a partial structure represented by Formula (6).

In Formula (6), m4 is 0 or 1. When m4 is 0, the aromatic group represents a benzene ring and when m4 is 1, the aromatic group represents a naphthalene ring. $R_{12}$ is a substituent bonded to the ring and examples thereof include an unsubstituted or substituted alkyl group having 1 to 10 carbon atom(s), a halogen atom and an alkoxy group having 1 to 10 carbon atom(s). These groups and the atom can represent the same as above exemplified. $R_{11}$ represents a hydrogen atom, a 1,2-quinonediazide group or derivatives thereof. When m4 is 0, m5 is an integer of 1 to 5 and m6 is an integer satisfying $0 \leq m6 \leq (5-m5)$, and when m4 is 1, m5 is an integer of 1 to 7 and m6 is an integer satisfying $0 \leq m6 \leq (5-m5)$.

In the compound (B), the ratio of the cross-linking group (B2) crosslinking with the crosslinkable compound (D) and the ratio of the group (B1) to be photodecomposed are determined based on whether $R_{11}$ in —$OR_{11}$ group is a hydrogen atom, or a 1,2-quinonediazide group or derivatives thereof. For forming an advantageous resist pattern, 10 to 98 mol %, preferably 20 to 95 mol % of the ratio of $R_{11}$ in all —$OR_{11}$ groups existing in the compound (B) are a 1,2-quinonediazide group or derivatives thereof.

Examples of the compound (B1) having a 1,2-naphthoquinonediazide group include 5-hydroxy-1,2-naphthoquinonediazide, 1,2-naphthoquinonediazide-5-sulfonyl chloride and 1,2-naphthoquinonediazide-4-sulfonyl chloride.

The compound (B2) having a hydroxyl group is preferably a compound having a phenolic hydroxyl group and examples thereof include a novolac-type phenolic compound, a benzophenone-type phenolic compound and a polyhydroxyalkane.

As such combinations, there can be mentioned the compound (B) represented by Formula (7). Here, $R_{11}$ and $R_{12}$ are the same as defined in Formula (6) and 10 to 98 mol %, preferably 20 to 95 mol % of $R_{11}$ in all —$OR_{11}$ groups existing in the compound (B) are a 1,2-quinonediazide group or derivatives thereof.

In Formula (7), $R_{11}$ and $R_{12}$ are the same as defined in Formula (6); $R_{13}$ is a hydrogen atom or an alkyl group having 1 to 10 carbon atom(s); m5 is an integer of 1 to 5; m6 is an integer satisfying $0 \leq m6 \leq (5-m5)$; m10 is an integer satisfying $0 \leq m10 \leq (5-m8-m9)$; m7 is an integer of 0 to 10; m8 is an integer of 0 to 1; m9 is an integer of 0 to 5; and 10 to 98 mol % of $R_{11}$ in all —$OR_{11}$ groups existing in the compound (B) are a 1,2-quinonediazide group or derivatives thereof.

In compound (B), $R_{11}$ is a compound represented by Formula (8) having a 1,2-naphthoquinonediazide group. $R_{15}$ is a hydrogen atom or an alkyl group having 1 to 10 carbon atom(s). As the alkyl group, the same group as described above can be used. In addition, when 5-hydroxy-1,2-naphthoquinonediazide is used, $R_{14}$ is a single bond and when 1,2-naphthoquinonediazide-5-sulfonyl chloride or 1,2-naphthoquinonediazide-4-sulfonyl chloride is used, $R_{14}$ is —$SO_3$— group.

Specific examples of the compound (B) include compounds represented by the following formulae. Here, D (that is, $R_{11}$) in the formulae represents a hydrogen atom or a 1,2-naphthoquinonediazide group.

[Chemical Formula 12]

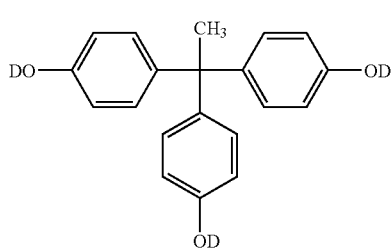

(3-1)

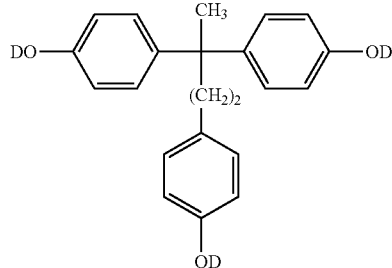

(3-2)

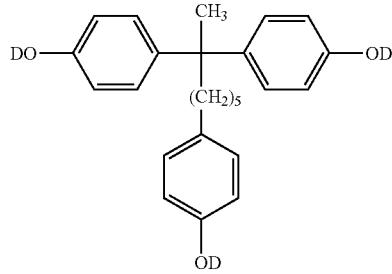

(3-3)

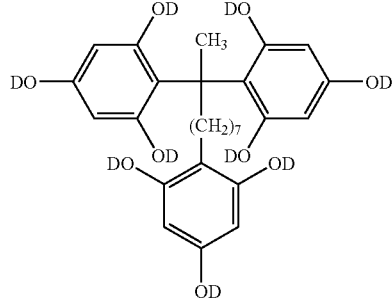

(3-4)

[Chemical Formula 13]

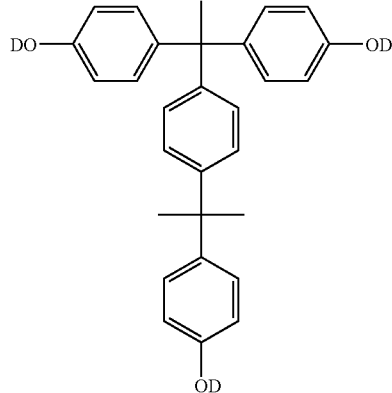

(3-5)

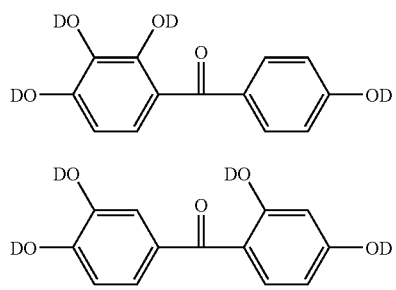

(3-6)

(3-6)

[Chemical Formula 14]

(3-7)

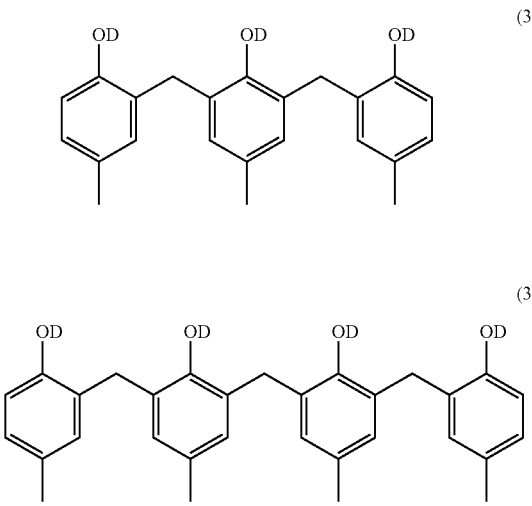

(3-8)

As the crosslinkable compound (D) used in the present invention, a compound having 2 or more, for example 2 to 6, groups capable of crosslinking-reaction, such as an isocyanate group, an epoxy group, a hydroxymethylamino group and an alkoxymethylamino group, can be used.

The crosslinkable compound (D) can contain, for example a crosslinkable compound represented by Formula (9):

[Chemical Formula 15]

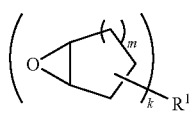

Formula (9)

(where k represents an integer of 2 to 10; m represents an integer of 0 to 4; and $R^1$ represents a k-valent organic group),
or Formula (10).

The compound D is not particularly limited so long as it is a compound represented by Formula (9) and having a cyclohexene oxide structure. Specific examples of the compound include compounds represented by Formulae (4-1) and (4-2):

[Chemical Formula 16]

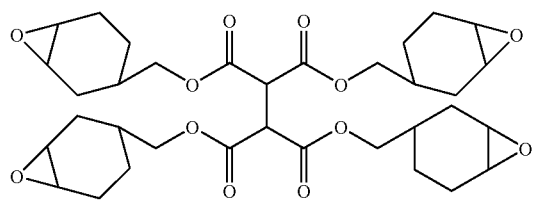

(4-1)

(4-2)

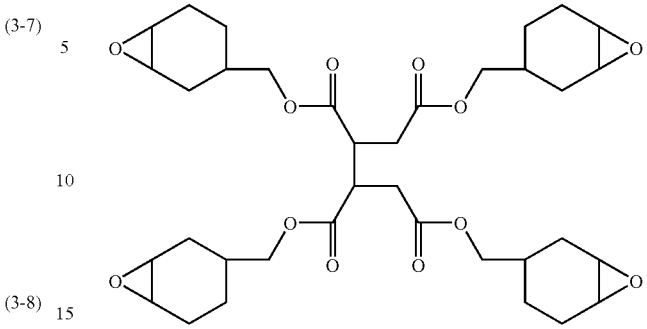

and the following commercially available products. Examples of the commercially available products include Epolead GT-401, Epolead GT-403, Epolead GT-301, Epolead GT-302, Celloxide 2021 and Celloxide 3000 (trade name; manufactured by Daicel Chemical Industries, Ltd.), Denacol EX-252 (trade name; manufactured by Nagase ChemteX Corporation; a cycloaliphatic epoxy resin), CY175, CY177, and CY179 (trade name; manufactured by CIBA-GEIGY A.G.), Araldite CY-182, Araldite CY-192 and Araldite CY-184 (trade name; manufactured by CIBA-GEIGY A.G.), Epiclon 200 and Epiclon 400 (trade name; manufactured by DIC Corporation), Epikote 871 and Epikote 872 (trade name; manufactured by Yuka Shell Epoxy K.K.), and ED-5661 and ED-5662 (trade name; Celanese Coating Company).

In addition, these crosslinkable compounds may be used individually or in combination of two or more types thereof.

Among them, from the viewpoint of process resistance such as heat resistance, solvent resistance and resistance to calcining for a long period, and transparency, preferred are compounds represented by Formula (4-1) and Formula (4-2), Epolead GT-401, Epolead GT-403, Epolead GT-301, Epolead GT-302, Celloxide 2021 and Celloxide 3000 which have cyclohexane oxide structures.

In addition, examples of the crosslinkable compound (D) include a compound represented by Formula (10):

[Chemical Formula 17]

Formula (10)

(where k represents an integer of 2 to 10; and $R_1$ represents a k-valent organic group).

The crosslinkable compound (D) is not particularly limited so long as it is a compound represented by Formula (10) and having an oxysilane structure. Specific examples of the compound include compounds represented by the following formula:

[Chemical Formula 18]

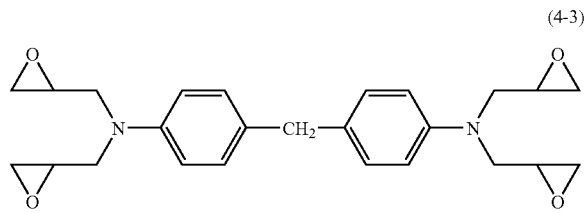

(4-3)

and the following commercially available products. Examples of the commercially available products include: bisphenol A-type epoxy resins such as "Epikote 828", "Epikote 834", "Epikote 1001" and "Epikote 1004" (trade name; manufactured by Japan Epoxy Resins Co., Ltd.), "Epiclon 850", "Epiclon 860" and "Epiclon 4055" (trade name; manufactured by DIC Corporation); bisphenol F-type epoxy resins such as "Epikote 807" (trade name; manufactured by Japan Epoxy Resins Co., Ltd.), and "Epiclon 830" (trade name; manufactured by DIC Corporation); phenol novolac-type epoxy resins such as "Epiclon N-740", "Epiclon N-770" and "Epiclon 775" (trade name; manufactured by DIC Corporation), and "Epikote 152" and "Epikote 154" (trade name; manufactured by Japan Epoxy Resins Co., Ltd.); cresolnovolac-type epoxy resins such as "Epiclon N-660", "Epiclon N-665", "Epiclon N-670", "Epiclon N-673", "Epiclon N-680", "Epiclon N-695", "Epiclon N-665-EXP" and "Epiclon N-672-EXP" (trade name; manufactured by DIC Corporation); and glycidylamine-type epoxy resins such as "Epiclon 430" and "Epiclon 430-L" (trade name; manufactured by DIC Corporation), "TETRAD-C" and "TETRAD-X" (trade name; manufactured by Mitsubishi Gas Chemical Company Inc.), "Epikote 604" and "Epikote 630" (trade name; manufactured by Japan Epoxy Resins Co., Ltd.), "Sumiepoxy ELM 120", "Sumiepoxy ELM 100", "Sumiepoxy ELM434" and "Sumiepoxy ELM434HV" (trade name; manufactured by Sumitomo Chemical Co., Ltd.), "Epotohto YH-434" and "Epotohto YH-434L" (trade name; manufactured by Tohto Kasei Co., Ltd.), and "Araldite MY-720" (trade name; manufactured by Asahi Ciba Co., Ltd.). In addition, these crosslinkable compounds may be used individually or in combination of two or more types thereof.

In addition, as the crosslinkable compound, a nitrogen-containing compound having nitrogen atoms substituted with a hydroxymethyl group or an alkoxymethyl group can be used. Specific examples of the nitrogen-containing compound include nitrogen-containing compounds such as hexamethoxymethylmelamine, tetramethoxymethylbenzoguanamine, 1,3,4,6-tetrakis(methoxymethyl)glycoluril, 1,3,4,6-tetrakis(butoxymethyl)glycoluril, 1,3,4,6-tetrakis(hydroxymethyl)glycoluril, 1,3-bis(hydroxymethyl)urea, 1,1,3,3-tetrakis(butoxymethyl)urea, 1,1,3,3-tetrakis(methoxymethyl)urea, 1,3-bis(hydroxymethyl)-4,5-dihydroxy-2-imidazolinone and 1,3-bis(methoxymethyl)-4,5-dimethoxy-2-imidazolinone. In addition, specific examples of the nitrogen-containing compound include commercially available nitrogen-containing compounds such as: methoxymethyl-type melamine compounds (trade name: Cymel 300, Cymel 301, Cymel 303 and Cymel 350; manufactured by Mitsui Cytec Ltd.); buthoxymethyl-type melamine compounds (trade name: Mycoat 506 and Mycoat 508 manufactured by Mitsui Cytec Ltd.); glycoluryl compounds (trade name: Cymel 1170 and Powderlink 1174; manufactured by Mitsui Cytec Ltd.); methylated urea resins (trade name: UFR 65; manufactured by Mitsui Cytec Ltd.); butylated urea resins (trade name: UFR 300, U-VAN 10S60, U-VAN 10R and U-VAN 11HV; manufactured by Mitsui Cytec Ltd.); and urea/formamide-type resins (trade name: BECKAMIN J-300S, BECKAMIN P-955 and BECKAMIN N; manufactured by DIC Corporation).

In addition, as the crosslinkable compound, there can be used polymers produced using acrylamide compounds or methacrylamide compounds substituted with a hydroxymethyl group or an alkoxymethyl group such as N-hydroxymethylacrylamide, N-methoxymethylmethacrylamide, N-ethoxymethylacrylamide and N-butoxymethylmethacrylamide. Examples of such a polymer include a poly(N-butoxymethylacrylamide), a copolymer of N-butoxymethylacrylamide with styrene, a copolymer of N-hydroxymethylmethacrylamide with methylmethacrylate, a copolymer of N-ethoxymethylmethacrylamide with benzylmethacrylate and a copolymer of N-butoxymethylacrylamide with benzylmethacrylate and 2-hydroxypropylmethacrylate.

As the crosslinkable compound, only one type of compounds may be used or a combination of two or more types of compounds may also be used.

The additive amount of the (D) component is 3 to 50 parts by mass, preferably 7 to 40 parts by mass, more preferably 10 to 30 parts by mass, relative to 100 parts by mass of the polymer (A). When the content of the crosslinkable compound is small, the density of a crosslinkage formed with the crosslinkable compound is not satisfactory, so that the effect of enhancing process resistance such as heat resistance, solvent resistance and resistance to calcining for a long period after the pattern formation may not be obtained. On the other hand, when the content of the crosslinkable compound is more than 50 parts by mass, uncrosslinked crosslinkable compounds remains, so that the resolution may be lowered or process resistance such as heat resistance, solvent resistance and resistance to calcining for a long period after the pattern formation may be lowered. Also, the preservation stability of the photosensitive resin composition may be impaired.

In the present invention, for the purpose of enhancing coating property, a surfactant (E) may be added. Such a surfactant is a fluorinated surfactant, a silicone-based surfactant, a nonionic surfactant, or the like and is not particularly limited. As the (E) component, there can be used any one type or a combination of two or more types of the above surfactants.

Among these surfactants, due to its high coating property-improving effectiveness, the fluorinated surfactant is preferred.

Specific examples of the fluorinated surfactant include Eftop EF301, EF303, and EF352 (trade name; manufactured by Tohkem Products Co., Ltd.), Megafac F171, F173, R-30, R-08, R-90, BL-20 and F-482 (trade name; manufactured by DIC Corporation), Fluorad FC 430 and FC431 (trade name; manufactured by Sumitomo 3M Limited), and Asahi Guard AG 710, Surflon S-382, SC101, SC102, SC103, SC104, SC105 and SC106 (trade name; manufactured by Asahi Glass Co., Ltd.), and are not limited to these examples.

The additive amount of the (E) component in the positive photosensitive resin composition of the present invention is 0.01 to 5 parts by mass, preferably 0.01 to 3 parts by mass, more preferably 0.01 to 2 parts by mass, relative to 100 parts by mass of the resin component. When the additive amount of the surfactant is more than 5 parts by mass, nonuniformity of the coating film is easily caused. On the other hand, when the additive amount is less than 0.01 parts by mass, a striation or the like is easily caused in the coating film.

In the present invention, for the purpose of enhancing the adhesion of the coating film with a substrate after the development, an adhesion accelerator (F) can be added. Examples of the adhesion accelerator include: chlorosilanes such as trimethylchlorosilane, dimethylvinylchlorosilane, methyldiphenylchlorosilane and chloromethyldimethylchlorosilane; alkoxysilanes such as trimethylmethoxysilane, dimethyldiethoxysilane, methyldimethoxysilane, dimethylvinylethoxysilane, diphenyldimethoxysilane and phenyltriethoxylsilane; silazanes such as hexamethyldisilazane, N,N'-bis(trimethylsilyl)urea, dimethyltrimethylsilylamine and trimethylsilylimidazol; silanes such as vinyltrichlorosilane, γ-chloropropyltrimethoxysilane, γ-aminopropyltriethoxysilane, γ-methacryloxypropyltrimethoxysilane, γ-glycidoxypropyltrimethoxysilane, and γ-(N-piperidinyl)propyltrimethoxysilane; heterocyclic compounds such as benzotriazole, benzimidazole, indazole, imidazole, 2-mercaptobenzimidazole, 2-mercaptobenzothiazole, 2-mercaptobenzooxazole, urazole, thiouracil, mercaptoimidazole and mercaptopyrimidine; and urea such as 1,1-dimethyl urea and 1,3-dimethyl urea, or thiourea compounds.

As the (F) component, these adhesion accelerators may be used individually or in combination of two or more types thereof.

The additive amount of the adhesion accelerator is usually 20 parts by mass or less, preferably 0.01 to 10 parts by mass, more preferably 0.5 to 10 parts by mass, relative to 100 parts by mass of the polymer (A). When the additive amount is 20 parts by mass or more, the heat resistance of the coating film may be lowered. On the other hand, when the additive amount is less than 0.1 parts by mass, a satisfactory effect of the adhesion accelerator may not be obtained.

As other additives, if necessary, there may be further added pigments, dyes, preservation stabilizers, antifoamers and dissolution accelerators such as polyphenols and polycarboxylic acids.

The positive resist composition of the present invention can be applied on a base material such as a glass substrate, a silicon wafer, an oxide film, a nitride film and a substrate coated with a metal such as aluminum, molybdenum and chromium by spin-coating, flow-coating, roll coating, slit coating, slit coating followed by spin-coating, inkjet coating or the like, and then can be pre-dried with a hot plate, an oven or the like to form a coating film. At this time, the pre-drying is performed preferably under conditions of a temperature of 80° C. to 130° C. and a time of 30 seconds to 60 seconds, however, if necessary, the conditions can be accordingly selected.

By fitting a mask having a predetermined pattern on the above-obtained coating film, by radiating light such as a ultraviolet (UV) ray to the film, and by developing the resultant pattern with an alkaline developer, an exposed part is washed away and a relief pattern having a sharp edge can be obtained. At this time, the developer used is not particularly limited so long as it is an alkaline aqueous solution. Specific examples of the developer include: an aqueous solution of alkali metal hydroxides such as potassium hydroxide, sodium hydroxide, potassium carbonate and sodium carbonate; an aqueous solution of quaternary ammonium hydroxides such as tetramethylammonium hydroxide, tetraethylammonium hydroxide and choline; and an aqueous solution of amines such as ethanolamine, propylamine and ethylenediamine.

The alkaline developer is generally an aqueous solution of 10% by mass or less, and preferably used is an aqueous solution of 0.1 to 3.0% by mass or the like. Further, to the developer, alcohols or surfactants can also be added to be used, and these substances are added in an amount of preferably 0.05 to 10 parts by mass, relative to 100 parts by mass of the developer.

Among them, a 0.1 to 2.38% by mass aqueous solution of tetramethylammonium hydroxide is generally used as a developer for the photoresist. For the positive resist of the present invention, by using this solution, the development can be performed without causing a problem of swelling or the like.

In addition, as the developing method, any of a liquid accumulation method, a dipping method, a vibration-immersion method and the like may be used. At this time, the developing time is usually 15 to 180 seconds. After the development, by cleaning the coating film with running water for 20 to 90 seconds and by air-drying the coating film with compressed air, compressed nitrogen or by spinning to remove moisture on the substrate, a coating film in which a pattern is formed can be obtained. Subsequently, by radiating light such as a UV ray using a high-pressure mercury lamp to the whole surface of the coating film in which a pattern is formed to perfectly decompose the (B) component (1,2-quinonedizide compound) remaining in the patterned coating film, whereby the transparency of the coating film is enhanced. Next, by heating the coating film using a hot plate, an oven, or the like, the coating film is subjected to curing treatment (hereinafter, referred to as "post bake"). Thus, a coating film that has an advantageous relief pattern and is excellent in heat resistance, transparency, planarized properties, low water-absorbing properties and chemical resistance can be obtained.

The conditions of the post bake may be a temperature of 140 to 250° C., and a time of 3 to 30 minutes on a hot plate or a time of 30 to 90 minutes in an oven. Thus, the desired cured film having an advantageous pattern can be obtained.

Thus, a cured film obtained from the coating film of the positive photosensitive resist composition of the present invention is excellent in heat resistance, solvent resistance and transparency.

Therefore, this cured film can be preferably used in an interlayer insulating film, various insulating films, various protective films, a microlens, and the like.

EXAMPLES

Synthesis Example 1

Synthesis of Polymer (A-1)

Into a 3 L three-neck flask, 200.0 g (1.30 mol) of 2-vinylnaphthalene, 133.3 g (1.55 mol) of methacrylic acid, 666.7 g of propylene glycol monomethyl ether as a solvent and 16.7 g of azobisbutyronitrile as an initiator were charged to be dissolved, and then the inside of the flask was purged with nitrogen. The temperature of the resultant solution was enhanced to effect the reaction at 60° C. for 6 hours, and was further enhanced, followed by stirring the reaction solution at 100° C. for 1 hour. The reaction solution was cooled and then was charged into a large amount of methanol aqueous solution (methanol concentration: 50% by mass) to reprecipitate a polymer and the polymer was dried by heating to obtain a polymer (A-1). The number average molecular weight converted into that of polystyrene (hereinafter, referred to as "Mn") and the weight average molecular weight converted into that of polystyrene (hereinafter, referred to as "Mw") of the obtained polymer were measured and found to be 4,200 and 9,000, respectively. The obtained polymer was redissolved in propylene glycol monomethyl ether to obtain a polymer (A-1) solution (solid content concentration: 34.4% by mass).

Synthesis Example 2

Synthesis of Polymer (A-2)

Into a 200 mL three-neck flask, 14.0 g (0.09 mol) of 2-vinylnaphthalene, 6.0 g (0.07 mol) of methacrylic acid, 60.0 g of cyclohexanone as a solvent and 1.6 g of azobisbutyronitrile as an initiator were charged to be dissolved, and then the inside of the flask was purged with nitrogen. The temperature of the resultant solution was enhanced to effect the reaction at 60° C. for 6 hours, and was further enhanced, followed by stirring the reaction solution at 100° C. for 1 hour. The reaction solution was cooled and then was charged into a large amount of methanol aqueous solution (methanol concentration: 50% by mass) to reprecipitate a polymer and the polymer was dried by heating to obtain a polymer (A-2). Mn and Mw of the obtained polymer were measured and found to be 4,500 and 9,500, respectively. The obtained polymer was redissolved in propylene glycol monomethyl ether to obtain a polymer (A-2) solution (solid content concentration: 26.5% by mass).

Synthesis Example 3

Synthesis of Polymer (A-3)

Into a 100 mL three-neck flask, 14.0 g (0.09 mol) of 2-vinylnaphthalene, 6.0 g (0.04 mol) of 4-vinylbenzoic acid, 60.0 g of cyclohexanone as a solvent and 1.0 g of azobisbutyronitrile as an initiator were charged to be dissolved, and then the inside of the flask was purged with nitrogen. The temperature of the resultant solution was enhanced to effect the reaction at 80° C. for 8 hours. Subsequently, to the reaction solution, further 0.6 g of azobisbutyronitrile was added and the reaction was effected at 80° C. for 12 hours. The temperature of the reaction solution was further enhanced and the reaction mixture was stirred at 100° C. for 1 hour to obtain a polymer (A-3) solution (26.5% by mass). Mn and Mw of the obtained polymer were measured and found to be 5,500 and 8,700, respectively.

Synthesis Example 4

Synthesis of Polymer (A-4)

Into a 100 mL three-neck flask, 13.0 g (0.08 mol) of 2-vinylnaphthalene, 6.0 g (0.07 mol) of methacrylic acid, 1.0 g (0.01 mol) of 2-hydroxyethyl methacrylate, 60.0 g of propylene glycol monomethyl ether as a solvent and 1.0 g of azobisbutyronitrile as an initiator were charged to be dissolved, and then the inside of the flask was purged with nitrogen. The temperature of the resultant solution was increased to effect the reaction at 80° C. for 8 hours. Subsequently, to the reaction solution, further 0.6 g of azobisbutyronitrile was added and the reaction was effected at 80° C. for 12 hours. The temperature of the reaction solution was further increased and the reaction solution was stirred at 100° C. for 1 hour to obtain a polymer (A-4) solution (25.9% by mass). Mn and Mw of the obtained polymer were measured and found to be 4,300 and 7,200, respectively.

Reference Synthesis Example 1

Synthesis of Polymer (A-5)

Into a 100 mL three-neck flask, 20.0 g (0.13 mol) of 2-vinylnaphthalene, 1.2 g (0.014 mol) of methacrylic acid, 68.7 g of propylene glycol monomethyl ether acetate as a solvent and 1.7 g of azobisbutyronitrile as an initiator were charged to be dissolved, and then the inside of the flask was purged with nitrogen. The temperature of the resultant solution was increased to effect the reaction at 60° C. for 18 hours and the temperature of the reaction solution was further increased, followed by stirring the reaction solution at 100° C. for 1 hour to obtain a polymer (A-5) solution (solid content concentration: 25.0% by mass). Mn and Mw of the obtained polymer were measured and found to be 4,500 and 9,500, respectively.

Reference Synthesis Example 2

Synthesis of Polymer (A-6)

Into a 100 mL three-neck flask, 3.5 g (0.023 mol) of 2-vinylnaphthalene, 17.6 g (0.20 mol) of methacrylic acid, 66.4 g of propylene glycol monomethyl ether as a solvent and 1.1 g of azobisbutyronitrile as an initiator were charged to be dissolved, and then the inside of the flask was purged with nitrogen. The temperature of the resultant solution was increased to effect the reaction at 60° C. for 18 hours and the temperature of the reaction solution was further increased, followed by stirring the reaction solution at 100° C. for 1 hour to obtain a polymer (A-6) solution (solid content concentration: 25.5% by mass). Mn and Mw of the obtained polymer were measured and found to be 5,400 and 11,200, respectively.

Example 1

Into a 50 mL eggplant-shaped flask, the polymer (A-1) solution (16.0 g), propylene glycol monomethyl ether (3.68 g) and propylene glycol monomethyl ether acetate (18.2 g) as solvents were charged and the resultant solution was stirred at room temperature. In the solution, no insoluble matter was observed and the solution was homogeneous.

Subsequently, a crosslinkable compound of Formula 4-2 (0.52 g), a sensitizer of Formula 3-5 (where 50 mol % of D was substituted by a 1,2-naphthoquinonediazide group and 50 mol % of D remained as a hydrogen atom) (0.96 g) and a surfactant (trade name: Megafac R-30; manufactured by DIC Corporation) (0.009 g) were added to the reaction solution which was further stirred at room temperature to obtain a resist composition (1) containing a copolymer having 2-vinylnaphthalene. In the solution, no insoluble matter was observed and a homogeneous solution was obtained.

A part of the solution was filtered using a 0.45 μm filter and the filtrate was left in a cleaned sample bottle at room temperature for 1 week. By a visual observation of the filtrate, no foreign matter was observed.

The resist composition (1) containing a copolymer having 2-vinylnaphthalene was filtered using a 0.45 μm filter and the filtrate was left in a cleaned sample bottle for 2 days. Subsequently, the resist composition (1) was applied on a silicon wafer subjected to hexamethylsilazane (hereinafter, referred to as "HMDS") treatment at 100° C. for 1 minute, using a spin coater and was calcined (soft-baked) on a hot plate at 110° C. for 2 minutes to form a coating film having a film thickness of 0.40 μm. This coating film was irradiated with a UV ray having an irradiating amount of 200 mJ/cm$^2$ at a wavelength of 365 nm using a UV ray irradiating apparatus (PLA-501(F); manufactured by Canon Inc.) through a test mask. Subsequently, the coating film was immersed in a 0.3% by mass tetramethylammonium hydroxide (hereinafter, referred to as "TMAH") aqueous solution of 23° C. for a certain time to be developed and was further subjected to running water cleaning with ultrapure water to form a positive pattern. The pattern was formed in a resolution of line/space of up to 2 μm without pattern peeling. The patterned coating film formed on the silicon wafer was visually observed under a sodium lamp and no foreign matter was observed on the film. In addition, the coating film was subjected to an optical microscope observation and no foreign matter was observed.

Subsequently, the whole surface of the coating film was irradiated with a UV ray having an irradiating amount of 500 mJ/cm$^2$ at a wavelength of 365 nm using a UV ray irradiating apparatus (PLA-501 (F); manufactured by Canon Inc.) and the coating film was post-baked on a hot plate at 200° C. for 5 minutes, followed by subjecting the coating film to an optical microscope observation. After the post-bake, this silicon wafer on which a pattern was formed was immersed in isopropyl alcohol for 10 minutes and was subjected to an optical microscope observation. As the result of the observation, there was observed no abnormal difference of the pattern between before and after the immersion in isopropanol.

In addition, the resist composition (1) was applied on a quartz substrate using a spin coater and was calcined (soft-baked) on a hot plate at 110° C. for 2 minutes to form a coating film having a film thickness of 0.40 μm. Subsequently, the whole surface of the coating film was irradiated with a UV ray having an irradiating amount of 500 mJ/cm$^2$ at a wavelength of 365 nm using a UV ray irradiating apparatus (PLA-501 (F); manufactured by Canon Inc.) and the coating film was post-baked on a hot plate at 200° C. for 5 minutes. The coating film was further baked at 250° C. for 30 minutes (in an air atmosphere). The transmittance of the coating film at a wavelength of 400 nm was measured using a UV ray-visible light spectrophotometer (UV-2550; manufactured by Shimadzu Corporation) and found to be 97%.

In addition, the resist composition (1) was applied on a silicon wafer using a spin coater and was calcined (soft-baked) on a hot plate at 110° C. for 2 minutes. Subsequently, the whole surface of the coating film was irradiated with a UV ray having an irradiating amount of 500 mJ/cm$^2$ at a wavelength of 365 nm using a UV ray irradiating apparatus (PLA-501 (F); manufactured by Canon Inc.) and the coating film was post-baked on a hot plate at 200° C. for 5 minutes. The refractive index of the coating film at a wavelength of 633 nm was measured using a spectroscopic ellipsometer and found to be 1.61.

Example 2

Into a 50 mL eggplant-shaped flask, the polymer (A-2) solution (16.0 g), propylene glycol monomethyl ether (3.68 g) and propylene glycol monomethyl ether acetate (18.2 g) as solvents were charged and the resultant solution was stirred at room temperature. In the solution, no insoluble matter was observed and the solution was homogeneous.

Subsequently, a crosslinkable compound of Formula 4-3 (0.52 g), a sensitizer of Formula 3-5 (where 50 mol % of D was substituted by a 1,2-naphthoquinonediazide group and 50 mol % of D remained as a hydrogen atom) (0.96 g) and a surfactant (trade name: Megafac R-30; manufactured by DIC Corporation) (0.009 g) were added to the reaction solution. The resultant solution was further stirred at room temperature to obtain a resist composition (2) containing a copolymer having 2-vinylnaphthalene. In the solution, no insoluble matter was observed and a homogeneous solution was obtained.

A part of the solution was filtered using a 0.45 μm filter and the filtrate was left in a cleaned sample bottle at room temperature for 1 week. By a visual observation of the filtrate, no foreign matter was observed.

The resist composition (2) containing a copolymer having 2-vinylnaphthalene was filtered using a 0.45 μm filter and the filtrate was left in a cleaned sample bottle for 2 days. Subsequently, the resist composition (2) was applied on a silicon wafer subjected to HMDS treatment at 100° C. for 1 minute, using a spin coater. The resist composition was calcined (soft-baked) on a hot plate at 110° C. for 2 minutes to form a coating film having a film thickness of 0.40 μm. This coating film was irradiated with a UV ray having an irradiating amount of 200 mJ/cm$^2$ at a wavelength of 365 nm using a UV ray irradiating apparatus (PLA-501(F); manufactured by Canon Inc.) through a test mask. Subsequently, the coating film was immersed in a 0.3% by mass TMAH aqueous solution of 23° C. for a certain time to be developed and was further subjected to running water cleaning with ultrapure water to form a positive pattern. The pattern was formed in a resolution of line/space of up to 2 μm without pattern peeling. The patterned coating film formed on the silicon wafer was visually observed under a sodium lamp and no foreign matter was observed on the film. In addition, the coating film was subjected to an optical microscope observation and no foreign matter was observed.

Subsequently, the whole surface of the coating film was irradiated with a UV ray having an irradiating amount of 500 mJ/cm$^2$ at a wavelength of 365 nm using a UV ray irradiating apparatus (PLA-501 (F); manufactured by Canon Inc.) and the coating film was post-baked on a hot plate at 200° C. for 5 minutes, followed by subjecting the coating film to an optical microscope observation. After the post-bake, this silicon wafer on which a pattern was formed was immersed in isopropyl alcohol for 10 minutes and was subjected to an optical microscope observation. As the result of the observation, there was observed no abnormal difference of the pattern between before and after the immersion in isopropanol.

In addition, the coating film was formed in substantially the same manner as in Example 1 and the transmittance of the coating film at a wavelength of 400 nm was measured and found to be 95%.

In addition, the coating film was formed in substantially the same manner as in Example 1 and the refractive index of the coating film at a wavelength of 633 nm was measured and found to be 1.62.

Example 3

Into a 50 mL eggplant-shaped flask, the polymer (A-3) solution (16.0 g), propylene glycol monomethyl ether (3.68 g) and propylene glycol monomethyl ether acetate (18.2 g) as solvents were charged and the resultant solution was stirred at room temperature. In the solution, no insoluble matter was observed and the solution was homogeneous.

Subsequently, a crosslinkable compound of Formula 4-2 (0.52 g), a sensitizer of Formula 3-5 (where 67 mol % of D was substituted by a 1,2-naphthoquinonediazide group and 33 mol % of D remained as a hydrogen atom) (0.96 g) and a surfactant (trade name: Megafac R-30; manufactured by DIC Corporation) (0.009 g) were added to the reaction solution. The resultant solution was further stirred at room temperature to obtain a resist composition (3) containing a copolymer having 2-vinylnaphthalene. In the solution, no insoluble matter was observed and a homogeneous solution was obtained.

A part of the solution was filtered using a 0.45 μm filter and the filtrate was left in a cleaned sample bottle at room temperature for 1 week. By a visual observation of the filtrate, no foreign matter was observed.

The resist composition (3) containing a copolymer having 2-vinylnaphthalene was filtered using a 0.45 μm filter and the filtrate was left in a cleaned sample bottle for 2 days. Subsequently, the resist composition (3) was applied on a silicon wafer subjected to HMDS treatment at 100° C. for 1 minute, using a spin coater. The resist composition was calcined (soft-baked) on a hot plate at 110° C. for 2 minutes to form a coating film having a film thickness of 0.40 μm. This coating film was irradiated with a UV ray having an irradiating amount of 200 mJ/cm$^2$ at a wavelength of 365 nm using a UV ray irradiating apparatus (PLA-501(F); manufactured by Canon Inc.) through a test mask. Subsequently, the coating film was immersed in a 0.3% by mass TMAH aqueous solution of 23° C. for a certain time to be developed and was further subjected to running water cleaning with ultrapure water to form a positive pattern. The pattern was formed in a resolution of line/space of up to 2 μm without pattern peeling. The patterned coating film formed on the silicon wafer was visually observed under a sodium lamp and no foreign matter was observed on the film. In addition, the coating film was subjected to an optical microscope observation and no foreign matter was observed.

Subsequently, the whole surface of the coating film was irradiated with a UV ray having an irradiating amount of 500 mJ/cm$^2$ at a wavelength of 365 nm using a UV ray irradiating apparatus (PLA-501 (F); manufactured by Canon Inc.) and the coating film was post-baked on a hot plate at 200° C. for 5 minutes, followed by subjecting the coating film to an optical microscope observation. After the post-bake, this silicon wafer on which a pattern was formed was immersed in isopropyl alcohol for 10 minutes and was subjected to an optical microscope observation. As the result of the observation, there was observed no abnormal difference of the pattern between before and after the immersion in isopropanol.

In addition, the coating film was formed in substantially the same manner as in Example 1 and the transmittance of the coating film at a wavelength of 400 nm was measured and found to be 96%.

In addition, the coating film was formed in substantially the same manner as in Example 1 and the refractive index of the coating film at a wavelength of 633 nm was measured and found to be 1.64.

Example 4

Into a 50 mL eggplant-shaped flask, the polymer (A-4) solution (16.0 g), propylene glycol monomethyl ether (3.68 g) and propylene glycol monomethyl ether acetate (18.2 g) as solvents were charged and the resultant solution was stirred at room temperature. In the solution, no insoluble matter was observed and the solution was homogeneous.

Subsequently, a crosslinkable compound of Formula 4-3 (0.52 g), a sensitizer of Formula 3-5 (where 67 mol % of D was substituted by a 1,2-naphthoquinonediazide group and 33 mol % of D remained as a hydrogen atom) (0.96 g) and a surfactant (trade name: Megafac R-30; manufactured by DIC Corporation) (0.009 g) were added to the reaction solution. The resultant solution was further stirred at room temperature to obtain a resist composition (4) containing a copolymer having 2-vinylnaphthalene. In the solution, no insoluble matter was observed and a homogeneous solution was obtained.

A part of the solution was filtered using a 0.45 μm filter and the filtrate was left in a cleaned sample bottle at room temperature for 1 week. By a visual observation of the filtrate, no foreign matter was observed.

The resist composition (4) containing a copolymer having 2-vinylnaphthalene was filtered using a 0.45 μm filter and the filtrate was left in a cleaned sample bottle for 2 days. Subsequently, the resist composition (4) was applied on a silicon wafer subjected to HMDS treatment at 100° C. for 1 minute, using a spin coater. The resist composition was calcined (soft-baked) on a hot plate at 110° C. for 2 minutes to form a coating film having a film thickness of 0.40 μm. This coating film was irradiated with a UV ray having an irradiating amount of 200 mJ/cm$^2$ at a wavelength of 365 nm using a UV ray irradiating apparatus (PLA-501(F); manufactured by Canon Inc.) through a test mask. Subsequently, the coating film was immersed in a 0.3% by mass TMAH aqueous solution of 23° C. for a certain time to be developed and was further subjected to running water cleaning with ultrapure water to form a positive pattern. The pattern was formed in a resolution of line/space of up to 2 μm without pattern peeling. The patterned coating film formed on the silicon wafer was visually observed under a sodium lamp and no foreign matter was observed on the film. In addition, the coating film was subjected to an optical microscope observation and no foreign matter was observed.

Subsequently, the whole surface of the coating film was irradiated with a UV ray having an irradiating amount of 500 mJ/cm$^2$ at a wavelength of 365 nm using a UV ray irradiating apparatus (PLA-501 (F); manufactured by Canon Inc.) and the coating film was post-baked on a hot plate at 200° C. for 5 minutes, followed by subjecting the coating film to an optical microscope observation. After the post-bake, this silicon wafer on which a pattern was formed was immersed in isopropyl alcohol for 10 minutes and was subjected to an optical microscope observation. As the result of the observation, there was observed no abnormal difference of the pattern between before and after the immersion in isopropanol.

In addition, the coating film was formed in substantially the same manner as in Example 1 and the transmittance of the coating film at a wavelength of 400 nm was measured and found to be 95%.

In addition, the coating film was formed in substantially the same manner as in Example 1 and the refractive index of the coating film at a wavelength of 633 nm was measured and found to be 1.61.

Example 5

Into a 50 mL eggplant-shaped flask, the polymer (A-1) solution (16.0 g), propylene glycol monomethyl ether (4.77 g) and propylene glycol monomethyl ether acetate (19.2 g) as solvents were charged and the resultant solution was stirred at room temperature. In the solution, no insoluble matter was observed and the solution was homogeneous.

Subsequently, a crosslinkable compound of Formula 4-2 (0.52 g), a sensitizer of Formula 3-1 (where 67 mol % of D was substituted by a 1,2-naphthoquinonediazide group and 33 mol % of D remained as a hydrogen atom) (1.28 g) and a surfactant (trade name: Megafac R-30; manufactured by DIC Corporation) (0.009 g) were added to the reaction solution. The resultant solution was further stirred at room temperature to obtain a resist composition (5) containing a copolymer having 2-vinylnaphthalene. In the solution, no insoluble matter was observed and a homogeneous solution was obtained.

A part of the solution was filtered using a 0.45 μm filter and the filtrate was left in a cleaned sample bottle at room temperature for 1 week. By a visual observation of the filtrate, no foreign matter was observed.

The resist composition (5) containing a copolymer having 2-vinylnaphthalene was filtered using a 0.45 μm filter and the filtrate was left in a cleaned sample bottle for 2 days. Subsequently, the resist composition (5) was applied on a silicon wafer subjected to HMDS treatment at 100° C. for 1 minute, using a spin coater. The resist composition was calcined (soft-baked) on a hot plate at 110° C. for 2 minutes to form a coating film having a film thickness of 0.40 μm. This coating film was irradiated with a UV ray having an irradiating amount of 200 mJ/cm$^2$ at a wavelength of 365 nm using a UV ray irradiating apparatus (PLA-501(F); manufactured by Canon Inc.) through a test mask. Subsequently, the coating film was immersed in a 0.3% by mass TMAH aqueous solution of 23° C. for a certain time to develop a pattern and was further subjected to running water cleaning with ultrapure water to form a positive pattern. The pattern was formed in a resolution of line/space of up to 2 μm without pattern peeling. The patterned coating film formed on the silicon wafer was visually observed under a sodium lamp and no foreign matter was observed on the film. In addition, the coating film was subjected to an optical microscope observation and no foreign matter was observed.

Subsequently, the whole surface of the coating film was irradiated with a UV ray having an irradiating amount of 500 mJ/cm$^2$ at a wavelength of 365 nm using a UV ray irradiating apparatus (PLA-501 (F); manufactured by Canon Inc.) and the coating film was post-baked on a hot plate at 200° C. for 5 minutes, followed by subjecting the coating film to an optical microscope observation. After the post-bake, this silicon wafer on which a pattern was formed was immersed in isopropyl alcohol for 10 minutes and was subjected to an optical microscope observation. As the result of the observation, there was observed no abnormal difference of the pattern between before and after the immersion in isopropanol.

In addition, the coating film was formed in substantially the same manner as in Example 1 and the transmittance of the coating film at a wavelength of 400 nm was measured and found to be 96%.

In addition, the coating film was formed in substantially the same manner as in Example 1 and the refractive index of the coating film at a wavelength of 633 nm was measured and found to be 1.61.

Example 6

Into a 50 mL eggplant-shaped flask, the polymer (A-1) solution (16.0 g), propylene glycol monomethyl ether (4.77 g) and propylene glycol monomethyl ether acetate (19.2 g) as solvents were charged and the resultant solution was stirred at room temperature. In the solution, no insoluble matter was observed and the solution was homogeneous.

Subsequently, a crosslinkable compound of Formula 4-3 (0.52 g), a sensitizer of Formula 3-2 (where 67 mol % of D was substituted by a 1,2-naphthoquinonediazide group and 33 mol % of D remained as a hydrogen atom) (1.28 g) and a surfactant (trade name: Megafac R-30; manufactured by DIC Corporation) (0.009 g) were added to the reaction solution. The resultant solution was further stirred at room temperature to obtain a resist composition (6) containing a copolymer having 2-vinylnaphthalene. In the solution, no insoluble matter was observed and a homogeneous solution was obtained.

A part of the solution was filtered using a 0.45 μm filter and the filtrate was left in a cleaned sample bottle at room temperature for 1 week. By a visual observation of the filtrate, no foreign matter was observed.

The resist composition (6) containing a copolymer having 2-vinylnaphthalene was filtered using a 0.45 μm filter and the filtrate was left in a cleaned sample bottle for 2 days. Subsequently, the resist composition (6) was applied on a silicon wafer subjected to HMDS treatment at 100° C. for 1 minute, using a spin coater. The resist composition was calcined (soft-baked) on a hot plate at 110° C. for 2 minutes to form a coating film having a film thickness of 0.40 p.m. This coating film was irradiated with a UV ray having an irradiating amount of 200 mJ/cm$^2$ at a wavelength of 365 nm using a UV ray irradiating apparatus (PLA-501(F); manufactured by Canon Inc.) through a test mask. Subsequently, the coating film was immersed in a 0.3% by mass TMAH aqueous solution of 23° C. for a certain time to be developed and was further subjected to running water cleaning with ultrapure water to form a positive pattern. The pattern was formed in a resolution of line/space of up to 2 μm without pattern peeling. The patterned coating film formed on the silicon wafer was visually observed under a sodium lamp and no foreign matter was observed on the film. In addition, the coating film was subjected to an optical microscope observation and no foreign matter was observed.

Subsequently, the whole surface of the coating film was irradiated with a UV ray having an irradiating amount of 500 mJ/cm$^2$ at a wavelength of 365 nm using a UV ray irradiating apparatus (PLA-501 (F); manufactured by Canon Inc.) and the coating film was post-baked on a hot plate at 200° C. for 5 minutes, followed by subjecting the coating film to an optical microscope observation. After the post-bake, this silicon wafer on which a pattern was formed was immersed in isopropyl alcohol for 10 minutes and was subjected to an optical microscope observation. As the result of the observation, there was observed no abnormal difference of the pattern between before and after the immersion in isopropanol.

In addition, the coating film was formed in substantially the same manner as in Example 1 and the transmittance of the coating film at a wavelength of 400 nm was measured and found to be 95%.

In addition, the coating film was formed in substantially the same manner as in Example 1 and the refractive index of the coating film at a wavelength of 633 nm was measured and found to be 1.61.

Example 7

Into a 50 mL eggplant-shaped flask, the polymer (A-1) solution (16.0 g), propylene glycol monomethyl ether (4.77 g) and propylene glycol monomethyl ether acetate (19.2 g) as solvents were charged and the resultant solution was stirred at room temperature. In the solution, no insoluble matter was observed and the solution was homogeneous.

Subsequently, a crosslinkable compound of Formula 4-2 (0.52 g), a sensitizer of Formula 3-2 (where 83 mol % of D was replaced by a 1,2-naphthoquinonediazide group and 17 mol % of D remained as a hydrogen atom) (1.28 g) and a surfactant (trade name: Megafac R-30; manufactured by DIC Corporation) (0.009 g) were added to the reaction solution. The resultant solution was further stirred at room temperature to obtain a resist composition (7) containing a copolymer having 2-vinylnaphthalene. In the solution, no insoluble matter was observed and a homogeneous solution was obtained.

A part of the solution was filtered using a 0.45 µm filter and the filtrate was left in a cleaned sample bottle at room temperature for 1 week. By a visual observation of the filtrate, no foreign matter was observed.

The resist composition (7) containing a copolymer having 2-vinylnaphthalene was filtered using a 0.45 µm filter and the filtrate was left in a cleaned sample bottle for 2 days. Subsequently, the resist composition (7) was applied on a silicon wafer subjected to HMDS treatment at 100° C. for 1 minute, using a spin coater. The resist composition was calcined (soft-baked) on a hot plate at 110° C. for 2 minutes to form a coating film having a film thickness of 0.40 µm. This coating film was irradiated with a UV ray having an irradiating amount of 200 mJ/cm$^2$ at a wavelength of 365 nm using a UV ray irradiating apparatus (PLA-501(F); manufactured by Canon Inc.) through a test mask. Subsequently, the coating film was immersed in a 0.3% by mass TMAH aqueous solution of 23° C. for a certain time to be developed and was further subjected to running water cleaning with ultrapure water to form a positive pattern. The pattern was formed in a resolution of line/space of up to 2 µm without pattern peeling. The patterned coating film formed on a silicon wafer was visually observed under a sodium lamp and no foreign matter was observed on the film. In addition, the coating film was subjected to an optical microscope observation and no foreign matter was observed.

Subsequently, the whole surface of the coating film was irradiated with a UV ray having an irradiating amount of 500 mJ/cm$^2$ at a wavelength of 365 nm using a UV ray irradiating apparatus (PLA-501 (F); manufactured by Canon Inc.) and the coating film was post-baked on a hot plate at 200° C. for 5 minutes, followed by subjecting the coating film to an optical microscope observation. After the post-bake, this silicon wafer on which a pattern was formed was immersed in isopropyl alcohol for 10 minutes and was subjected to an optical microscope observation. As the result of the observation, there was observed no abnormal difference of the pattern between before and after the immersion in isopropanol.

In addition, the coating film was formed in substantially the same manner as in Example 1 and the transmittance of the coating film at a wavelength of 400 nm was measured and found to be 96%.

In addition, the coating film was formed in substantially the same manner as in Example 1 and the refractive index of the coating film at a wavelength of 633 nm was measured and found to be 1.61.

Example 8

Into a 50 mL eggplant-shaped flask, the polymer (A-2) solution (16.0 g), propylene glycol monomethyl ether (4.77 g) and propylene glycol monomethyl ether acetate (19.2 g) as solvents were charged and the resultant solution was stirred at room temperature. In the solution, no insoluble matter was observed and the solution was homogeneous.

Subsequently, a crosslinkable compound of Formula 4-3 (0.52 g), a sensitizer of Formula 3-1 (where 50 mol % of D was substituted by a 1,2-naphthoquinonediazide group and 50 mol % of D remained as a hydrogen atom) (1.28 g) and a surfactant (trade name: Megafac R-30; manufactured by DIC Corporation) (0.009 g) were added to the reaction solution. The resultant solution was further stirred at room temperature to obtain a resist composition (8) containing a copolymer having 2-vinylnaphthalene. In the solution, no insoluble matter was observed and a homogeneous solution was obtained.

A part of the solution was filtered using a 0.45 µm filter and the filtrate was left in a cleaned sample bottle at room temperature for 1 week. By a visual observation of the filtrate, no foreign matter was observed.

The resist composition (8) containing a copolymer having 2-vinylnaphthalene was filtered using a 0.45 µm filter and the filtrate was left in a cleaned sample bottle for 2 days. Subsequently, the resist composition (8) was applied on a silicon wafer subjected to HMDS treatment at 100° C. for 1 minute, using a spin coater. The resist composition was calcined (soft-baked) on a hot plate at 110° C. for 2 minutes to form a coating film having a film thickness of 0.40 p.m. This coating film was irradiated with a UV ray having an irradiating amount of 200 mJ/cm$^2$ at a wavelength of 365 nm using a UV ray irradiating apparatus (PLA-501(F); manufactured by Canon Inc.) through a test mask. Subsequently, the coating film was immersed in a 0.3% by mass TMAH aqueous solution of 23° C. for a certain time to be developed and was further subjected to running water cleaning with ultrapure water to form a positive pattern. The pattern was formed in a resolution of line/space of up to 2 µm without pattern peeling. The patterned coating film formed on the silicon wafer was visually observed under a sodium lamp and no foreign matter was observed on the film. In addition, the coating film was subjected to an optical microscope observation and no foreign matter was observed.

Subsequently, the whole surface of the coating film was irradiated with a UV ray having an irradiating amount of 500 mJ/cm$^2$ at a wavelength of 365 nm using a UV ray irradiating apparatus (PLA-501 (F); manufactured by Canon Inc.) and the coating film was post-baked on a hot plate at 200° C. for 5 minutes, followed by subjecting the coating film to an optical microscope observation. After the post-bake, this silicon wafer on which a pattern was formed was immersed in isopropyl alcohol for 10 minutes and was subjected to an optical microscope observation. As the result of the observation, there was observed no abnormal difference of the pattern between before and after the immersion in isopropanol.

In addition, the coating film was formed in substantially the same manner as in Example 1 and the transmittance of the coating film at a wavelength of 400 nm was measured and found to be 95%.

In addition, the coating film was formed in substantially the same manner as in Example 1 and the refractive index of the coating film at a wavelength of 633 nm was measured and found to be 1.62.

Comparative Examples 1

Into a 50 mL eggplant-shaped flask, a propylene glycol monomethyl ether solution (16.0 g, solid content: 25% by mass, Mn: 7,500, Mw: 15,000) of polyhydroxystyrene (manufactured by Maruzen Petrochemical Co., Ltd.), propylene glycol monomethyl ether (4.77 g) and propylene glycol monomethyl ether acetate (19.2 g) as solvents were charged and the resultant solution were stirred at room temperature. In the solution, no insoluble matter was observed and the solution was homogeneous.

Subsequently, a crosslinkable compound of Formula 4-3 (0.52 g), a sensitizer of Formula 3-1 (where 50 mol % of D was substituted by a 1,2-naphthoquinonediazide group and 50 mol % of D remained as a hydrogen atom) (1.28 g) and a surfactant (trade name: Megafac R-30; manufactured by DIC Corporation) (0.009 g) were added to the reaction solution. The resultant solution was further stirred at room temperature to obtain a resist composition (9) containing polyhydroxystyrene. In the solution, no insoluble matter was observed and a homogeneous solution was obtained.

A part of the solution was filtered using a 0.45 μm filter and the filtrate was left in a cleaned sample bottle at room temperature for 1 week. By a visual observation of the filtrate, no foreign matter was observed.

The resist composition (9) was filtered using a 0.45 μm filter and the filtrate was left in a cleaned sample bottle for 2 days. Subsequently, the resist composition (9) was applied on a silicon wafer subjected to HMDS treatment at 100° C. for 1 minute, using a spin coater. The resist composition was calcined (soft-baked) on a hot plate at 110° C. for 2 minutes to form a coating film having a film thickness of 0.40 μm. This coating film was irradiated with a UV ray having an irradiating amount of 200 mJ/cm$^2$ at a wavelength of 365 nm using a UV ray irradiating apparatus (PLA-501(F); manufactured by Canon Inc.) through a test mask. Subsequently, the coating film was immersed in a 1.0% by mass TMAH aqueous solution of 23° C. for a certain time to be developed and was further subjected to running water cleaning with ultrapure water to form a positive pattern. The pattern was formed in a resolution of line/space of up to 2 μm without pattern peeling. The patterned coating film formed on the silicon wafer was visually observed under a sodium lamp and no foreign matter was observed on the film. In addition, the coating film was subjected to an optical microscope observation and no foreign matter was observed.

Subsequently, the whole surface of the coating film was irradiated with a UV ray having an irradiating amount of 500 mJ/cm$^2$ at a wavelength of 365 nm using a UV ray irradiating apparatus (PLA-501 (F); manufactured by Canon Inc.) and the coating film was post-baked on a hot plate at 200° C. for 5 minutes, followed by subjecting the coating film to an optical microscope observation. After the post-bake, this silicon wafer on which a pattern was formed was immersed in isopropyl alcohol for 10 minutes and was subjected to an optical microscope observation. As the result of the observation, there was observed no abnormal difference of the pattern between before and after the immersion in isopropanol.

In addition, the coating film was formed in substantially the same manner as in Example 1 and the transmittance of the coating film at a wavelength of 400 nm was measured and found to be 70%.

In addition, the coating film was formed in substantially the same manner as in Example 1 and the refractive index of the coating film at a wavelength of 633 nm was measured and found to be 1.61.

Reference Example 1

Into a 50 mL eggplant-shaped flask, the polymer (A-5) solution (15.0 g), propylene glycol monomethyl ether (6.7 g) and propylene glycol monomethyl ether acetate (15.6 g) as solvents were charged and the resultant solution was stirred at room temperature. In the solution, no insoluble matter was observed and the solution was homogeneous.

Subsequently, a crosslinkable compound of Formula 4-3 (0.56 g), a sensitizer of Formula 3-5 (where 50 mol % of D was substituted by a 1,2-naphthoquinonediazide group and 50 mol % of D remained as a hydrogen atom) (1.13 g) and a surfactant (trade name: Megafac R-30; manufactured by DIC Corporation) (0.01 g) were added to the reaction solution. The resultant solution was further stirred at room temperature to obtain a resist composition (10) containing a copolymer having 2-vinylnaphthalene. In the solution, no insoluble matter was observed and a homogeneous solution was obtained.

A part of the solution was filtered using a 0.45 μm filter and the filtrate was left in a cleaned sample bottle at room temperature for 1 week. By a visual observation of the filtrate, no foreign matter was observed.

The resist composition (10) containing a copolymer having 2-vinylnaphthalene was filtered using a 0.45 μm filter and the filtrate was left in a cleaned sample bottle for 2 days. Subsequently, the resist composition (10) was applied on a silicon wafer subjected to HMDS treatment at 100° C. for 1 minute, using a spin coater. The resist composition was calcined (soft-baked) on a hot plate at 110° C. for 2 minutes to form a coating film having a film thickness of 0.40 μm. This coating film was irradiated with a UV ray having an irradiating amount of 200 mJ/cm$^2$ at a wavelength of 365 nm using a UV ray irradiating apparatus (PLA-501(F); manufactured by Canon Inc.) through a test mask. Subsequently, the coating film was immersed in a 2.38% by mass TMAH aqueous solution of 23° C. for a certain time to be developed and was further subjected to running water cleaning with ultrapure water, however, an advantageous positive pattern was not formed.

Reference Example 2

Into a 50 mL eggplant-shaped flask, the polymer (A-6) solution (15.0 g), propylene glycol monomethyl ether (16.2 g) and propylene glycol monomethyl ether acetate (6.8 g) as solvents were charged and the resultant solution was stirred at room temperature. In the solution, no insoluble matter was observed and the solution was homogeneous.

Subsequently, a crosslinkable compound of Formula 4-3 (0.57 g), a sensitizer of Formula 3-5 (where 50 mol % of D was substituted by a 1,2-naphthoquinonediazide group and 50 mol % of D remained as a hydrogen atom) (1.15 g) and a surfactant (trade name: Megafac R-30; manufactured by DIC Corporation) (0.01 g) were added to the reaction solution. The resultant solution was further stirred at room temperature to obtain a resist composition (11) containing a copolymer having 2-vinylnaphthalene. In the solution, no insoluble matter was observed and a homogeneous solution was obtained.

A part of the solution was filtered using a 0.45 μm filter and the filtrate was left in a cleaned sample bottle at room temperature for 1 week. By a visual observation of the filtrate, no foreign matter was observed.

The resist composition (11) containing a copolymer having 2-vinylnaphthalene was filtered using a 0.45 μm filter and the filtrate was left in a cleaned sample bottle for 2 days. Subsequently, the resist composition (11) was applied on a silicon wafer subjected to HMDS treatment at 100° C. for 1 minute, using a spin coater. The resist composition was calcined (soft-baked) on a hot plate at 110° C. for 2 minutes to form a coating film having a film thickness of 0.40 μm. This coating film was irradiated with a UV ray having an irradiating amount of 200 mJ/cm$^2$ at a wavelength of 365 nm using a UV ray irradiating apparatus (PLA-501(F); manufactured by Canon Inc.) through a test mask. Subsequently, the coating film was immersed in a 0.2% by mass TMAH aqueous solution of 23° C. for a certain time to be developed and was further subjected to running water cleaning with ultrapure water, however, an advantageous positive pattern was not be formed.

Reference Example 3

Into a 50 mL eggplant-shaped flask, the polymer (A-2) solution (16.0 g), propylene glycol monomethyl ether (3.68 g) and propylene glycol monomethyl ether acetate (18.2 g) as solvents were charged and the resultant solution was stirred at room temperature. In the solution, no insoluble matter was observed and the solution was homogeneous.

Subsequently, a crosslinkable compound of Formula 4-2 (0.52 g), a sensitizer of Formula 3-9 (where 50 mol % of D was substituted by a 1,2-naphthoquinonediazide group and 50 mol % of D remained as a hydrogen atom, a Mw was 5,000) (0.96 g) and a surfactant (trade name: Megafac R-30; manufactured by DIC Corporation) (0.009 g) were added to the reaction solution. The resultant solution was further stirred at room temperature to obtain a resist composition (12) containing a copolymer having 2-vinylnaphthalene. In the solution, no insoluble matter was observed and a homogeneous solution was obtained.

[Chemical Formula 19]

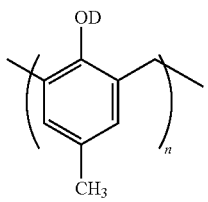

Formula (3-9)

A part of the solution was filtered using a 0.45 μm filter and the filtrate was left in a cleaned sample bottle at room temperature for 1 week. By a visual observation of the filtrate, no foreign matter was observed.

The resist composition (12) containing a copolymer having 2-vinylnaphthalene was filtered using a 0.45 μm filter and the filtrate was left in a cleaned sample bottle for 2 days. Subsequently, the resist composition (12) was applied on a silicon wafer subjected to HMDS treatment at 100° C. for 1 minute, using a spin coater. The resist composition was calcined (soft-baked) on a hot plate at 110° C. for 2 minutes to form a coating film having a film thickness of 0.40 μm. This coating film was irradiated with a UV ray having an irradiating amount of 200 mJ/cm$^2$ at a wavelength of 365 nm using a UV ray irradiating apparatus (PLA-501(F); manufactured by Canon Inc.) through a test mask. Subsequently, the coating film was immersed in a 0.4% by mass TMAH aqueous solution of 23° C. for a certain time to be developed and was further subjected to running water cleaning with ultrapure water to form a positive pattern. The pattern was formed in a resolution of line/space of up to 2 μm without pattern peeling. The patterned coating film formed on the silicon wafer was visually observed under a sodium lamp and no foreign matter was observed on the film. In addition, the coating film was subjected to an optical microscope observation and no foreign matter was observed.

Subsequently, the whole surface of the coating film was irradiated with a UV ray having an irradiating amount of 500 mJ/cm$^2$ at a wavelength of 365 nm using a UV ray irradiating apparatus (PLA-501 (F); manufactured by Canon Inc.) and the coating film was post-baked on a hot plate at 200° C. for 5 minutes, followed by subjecting the coating film to an optical microscope observation. After the post-bake, this silicon wafer on which a pattern was formed was immersed in isopropyl alcohol for 10 minutes and was subjected to an optical microscope observation. As the result of the observation, there was observed no abnormal difference of the pattern between before and after the immersion in isopropanol.

In addition, the coating film was formed in substantially the same manner as in Example 1 and the transmittance of the coating film at a wavelength of 400 nm was measured and found to be 82%.

In addition, the coating film was formed in substantially the same manner as in Example 1 and the refractive index of the coating film at a wavelength of 633 nm was measured and found to be 1.62.

INDUSTRIAL APPLICABILITY

The positive resist composition of the present invention is a material applicable to the miniaturization of a solid-state imaging device and having weatherability for a vehicle-installation and the like and is excellent in terms of resolution, heat resistance and transparency. In addition, the positive resist composition of the present invention can be applied to a solid-state imaging device or the like.

The invention claimed is:
1. A positive resist composition comprising:
an alkali-soluble polymer (A) containing a unit structure having an aromatic fused ring or a derivative thereof;
a compound (B) having an organic group which undergoes photodecomposition to yield an alkali-soluble group; and
a crosslinkable compound (D), wherein:
the polymer (A) is a polymer containing:
a unit structure represented by Formula (2):

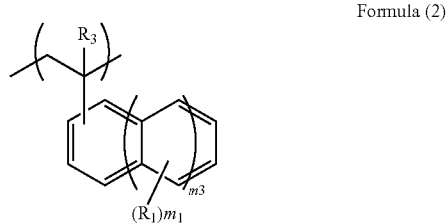

Formula (2)

where:
R$_1$ represents a halogen atom, an alkyl group, an alkoxy group, a thiol group, a cyano group, an amino group, an amide group, an alkylcarbonyl group, or a thioalkyl group;
R$_3$ represents a hydrogen atom or a methyl group;
m3 represents an integer of 1 or 2;
when m3=1, m$_1$ represents an integer of 0 to 7; and
when m3=2, m$_1$ represents an integer of 0 to 9; and
a unit structure represented by Formula (3):

Formula (3)

where:
R$_4$ and R$_5$ individually represents a hydrogen atom, a methyl group, a carboxyl group, or an alkylenecarboxyl group having 1 to 3 carbon atoms, and
Q represents a single bond, an alkylene group having 1 to 3 carbon atoms, or an aromatic group having 6 to 10 carbon atoms;
when a total number of all unit structures constituting the polymer (A) is 1.0, a ratio of a number n2 of unit structures represented by Formula (2) and a ratio of a number n3 of unit structures represented by Formula (3) satisfy $0.2 \leq n2 \leq 0.8$, $0.1 \leq n3 \leq 0.7$, and $0.3 \leq n2+n3 \leq 1.0$; and the compound (B) has a structure represented by Formula (7):

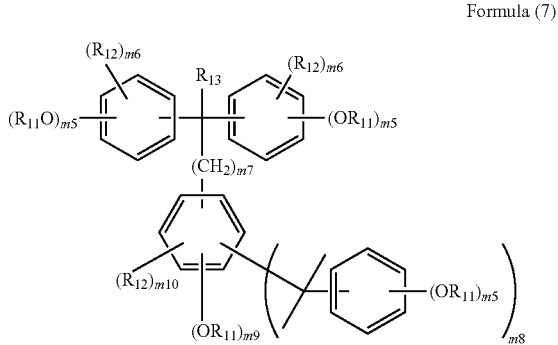

Formula (7)

where:

$R_{11}$ represents a hydrogen atom, a 1,2-quinonediazide group, or a derivative thereof;

$R_{12}$ represents an unsubstituted or substituted alkyl group having 1 to 10 carbon atoms, a halogen atom, or an alkoxy group having 1 to 10 carbon atoms;

$R_{13}$ represents a hydrogen atom or an alkyl group having 1 to 10 carbon atoms;

m5 represents an integer of 1 to 5;

m6 represents an integer satisfying $0 \leq m6 \leq (5-m5)$;

m10 represents an integer satisfying $0 \leq m10 \leq (5-m8-m9)$;

m7 represents an integer of 0 to 10;

m8 represents an integer of 0 or 1;

m9 represents an integer of 0 to 5; and in all —$OR_{11}$ groups existing in the compound (B), $R_{11}$ is a 1,2-quinonediazide group or a derivative thereof in an amount of 10 to 98 mol%, wherein the positive resist composition is formulated so that upon curing a film of the positive resist composition, the cured film has a transmittance of 80% or more at wavelengths of 400 to 730 nm.

2. The positive resist composition according to claim 1, wherein:

the polymer (A) further comprises:

a unit structure represented by Formula (4):

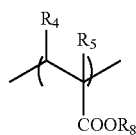

Formula (4)

where:

$R_4$ and $R_5$ individually represents a hydrogen atom, a methyl group, a carboxyl group, or an alkylenecarboxyl group having 1 to 3 carbon atoms, and $R_8$ represents an unsubstituted or substituted alkyl group having 1 to 10 carbon atoms, a hydroxyalkyl group having 1 to 6 carbon atoms, an epoxy group having 3 to 6 carbon atoms, an aromatic group having 6 to 20 carbon atoms, or a combination thereof;

a unit structure represented by Formula (5):

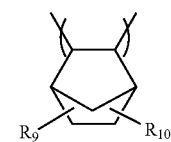

Formula (5)

where:

$R_9$ and $R_{10}$ individually represents an unsubstituted or substituted alkyl group having 1 to 10 carbon atoms, a hydroxyalkyl group having 1 to 6 carbon atoms, a hydroxyl group, a halogen atom, a carboxyl group, or an alkoxy group having 1 to 10 carbon atoms; or a unit structure containing a combination of unit structures represented by Formula (4) and Formula (5);

when the total number of all unit structures constituting the polymer (A) is 1.0, the ratio of the number n2 of unit structures represented by Formula (2) and the ratio of the number n3 of unit structures represented by Formula (3) satisfy $0.2 \leq n2 \leq 0.8$ and $0.1 \leq n3 \leq 0.7$;

when the polymer (A) contains the unit structure represented by Formula (2), the unit structure represented by Formula (3), and the unit structure represented by Formula (4), a ratio of a number n4 of unit structures represented by Formula (4) satisfies $0 \leq n4' 0.4$;

when the polymer (A) contains the unit structure represented by Formula (2), the unit structure represented by Formula (3), and the unit structure represented by Formula (5), a ratio of a number n5 of unit structures represented by Formula (5) satisfies $0 \leq n5 \leq 0.4$; and when the polymer (A) contains the unit structure represented by Formula (2), the unit structure represented by Formula (3), the unit structure represented by Formula (4), and the unit structure represented by Formula (5), the number n4+n5 of unit structures satisfies $0 \leq n4+n5 \leq 0.4$ and $0.3 \leq n2+n3+n4+n5 \leq 1.0$.

3. The positive resist composition according to claim 1, wherein, in the compound (B) represented by Formula (7), $R_{11}$ in the formula is represented by Formula (8):

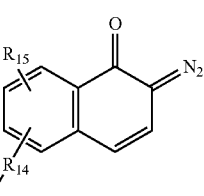

Formula (8)

where:

$R_{14}$ represents a single bond or —$SO_2$— group, and $R_{15}$ represents a hydrogen atom or an alkyl group having 1 to 10 carbon atoms.

4. The positive resist composition according to claim 1, wherein the positive resist composition is formulated so that upon curing a film of the positive resist composition, the cured film has a refractive index of 1.6 or more at a wavelength of 633 nm.

5. A pattern forming method comprising:
   applying the positive resist composition as claimed in claim 1 on a substrate;
   drying the composition;
   exposing the composition to light; and
   developing the composition.

6. An LED display device comprising:
   a planarized film formed by the process as claimed in claim 5.

7. A solid-state imaging device comprising:
   a convex microlens obtained by subjecting the pattern formed by the method of claim 5 to thermal reflow.

8. The positive resist composition according to claim 4, wherein, in the compound (B) represented by Formula (7), $R_{11}$ in the formula is represented by Formula (8):

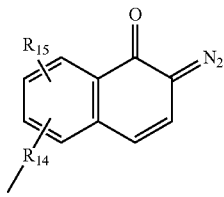

Formula (8)

where:
   $R_{14}$ represents a single bond or —$SO_2$— group; and
   $R_{15}$ represents a hydrogen atom or an alkyl group having 1 to 10 carbon atoms.

9. The positive resist composition according to claim 2, wherein the positive resist composition is formulated so that upon curing a film of the positive resist composition, the cured film has a refractive index of 1.6 or more at a wavelength of 633 nm.

10. The positive resist composition according to claim 3, wherein the positive resist composition is formulated so that upon curing a film of the positive resist composition, the cured film has a refractive index of 1.6 or more at a wavelength of 633 nm.

* * * * *